US010453898B2

(12) United States Patent
Hirata et al.

(10) Patent No.: US 10,453,898 B2
(45) Date of Patent: Oct. 22, 2019

(54) SOLID STATE IMAGE SENSOR PIXEL ELECTRODE BELOW A PHOTOELECTRONIC CONVERSION FILM

(71) Applicant: SONY SEMICONDUCTOR SOLUTIONS CORPORATION, Kanagawa (JP)

(72) Inventors: Shintarou Hirata, Tokyo (JP); Tetsuji Yamaguchi, Kanagawa (JP); Fumihiko Koga, Kanagawa (JP); Shinpei Fukuoka, Kanagawa (JP); Shuji Manda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 95 days.

(21) Appl. No.: 15/528,580

(22) PCT Filed: Dec. 11, 2015

(86) PCT No.: PCT/JP2015/084761
§ 371 (c)(1),
(2) Date: May 22, 2017

(87) PCT Pub. No.: WO2016/104177
PCT Pub. Date: Jun. 30, 2016

(65) Prior Publication Data
US 2018/0342558 A1  Nov. 29, 2018

(30) Foreign Application Priority Data

Dec. 26, 2014 (JP) ................... 2014-264288
Oct. 16, 2015 (JP) ................... 2015-204246

(51) Int. Cl.
H01L 31/062 (2012.01)
H01L 21/00 (2006.01)
(Continued)

(52) U.S. Cl.
CPC .......... *H01L 27/307* (2013.01); *H01L 27/286* (2013.01); *H04N 5/357* (2013.01);
(Continued)

(58) Field of Classification Search
CPC . H01L 27/307; H01L 27/286; H01L 27/3244; H01L 27/284; H04N 5/357; H04N 5/3696; H04N 5/374
See application file for complete search history.

(56) References Cited

U.S. PATENT DOCUMENTS 5,306,655 A  4/1994 Kurimoto
5,405,787 A  4/1995 Kurimoto
(Continued)

FOREIGN PATENT DOCUMENTS

CN  101431088 A  5/2009
CN  102196195 A  9/2011
(Continued)

OTHER PUBLICATIONS

International Search Report and Written Opinion of PCT Application No. PCT/JP2015/084761, dated Feb. 23, 2016, 15 pages of English Translation and 11 pages of ISRWO.

*Primary Examiner* — Alonzo Chambliss
(74) *Attorney, Agent, or Firm* — Chip Law Group

(57) ABSTRACT

The present disclosure relates to a solid state image sensor capable of reducing signal mixture due to electric capacitive coupling between adjacent pixels, a method for manufacturing the same, and an electronic device. A first pixel and a second pixel are adjacently arranged in the solid state image sensor. Each of the first pixel and the second pixel has a photoelectric conversion film for photoelectrically converting an incident light, and a lower electrode arranged below the photoelectric conversion film, and another electrode different from the lower electrodes is provided (Continued)

between the lower electrodes of the first pixel and the second pixel. The present disclosure is applicable to solid state image sensors and the like, for example.

19 Claims, 32 Drawing Sheets

(51) Int. Cl.
| | |
|---|---|
| *H01L 27/30* | (2006.01) |
| *H01L 27/28* | (2006.01) |
| *H04N 5/357* | (2011.01) |
| *H04N 5/369* | (2011.01) |
| *H04N 5/374* | (2011.01) |
| *H04N 5/359* | (2011.01) |
| *H04N 5/378* | (2011.01) |
| *H01L 27/146* | (2006.01) |

(52) U.S. Cl.
CPC ........... *H04N 5/3696* (2013.01); *H04N 5/374* (2013.01); *H01L 27/14647* (2013.01); *H04N 5/3597* (2013.01); *H04N 5/378* (2013.01)

(56) References Cited

U.S. PATENT DOCUMENTS

| | | | |
|---|---|---|---|
| 9,054,243 B2* | 6/2015 | Sawayama | ........ H01L 27/14629 |
| 2004/0004254 A1 | 1/2004 | Watanabe | |
| 2009/0115014 A1 | 5/2009 | Kim | |
| 2011/0216212 A1 | 9/2011 | Watanabe et al. | |
| 2011/0272772 A1* | 11/2011 | Kokubun | .......... H01L 27/14632 |
| | | | 257/432 |
| 2012/0086095 A1 | 4/2012 | Nishiyama et al. | |
| 2013/0341491 A1 | 12/2013 | Hirose et al. | |
| 2015/0097966 A1 | 4/2015 | Nishiyama | |
| 2016/0249000 A1* | 8/2016 | Esumi | ............... H01L 27/14609 |

FOREIGN PATENT DOCUMENTS

| | | |
|---|---|---|
| CN | 103404124 A | 11/2013 |
| JP | 3-174772 A | 7/1991 |
| JP | 4-348038 A | 12/1992 |
| JP | 5-13748 A | 1/1993 |
| JP | 8-116045 A | 5/1996 |
| JP | 2004-39794 A | 2/2004 |
| JP | 2011-109514 A | 6/2011 |
| JP | 2011-187544 A | 9/2011 |
| JP | 2012-114160 A | 6/2012 |
| JP | 5547717 B2 | 7/2014 |
| JP | 2014-195296 A | 10/2014 |
| JP | 2015-192125 A | 11/2015 |
| KR | 10-2004-0004146 A | 1/2004 |
| KR | 10-2009-0046173 A | 5/2009 |
| TW | 200410407 A | 6/2004 |
| WO | 2010/116974 A1 | 10/2010 |
| WO | 2012/070171 A1 | 5/2012 |
| WO | 2012/117670 A1 | 9/2012 |

* cited by examiner

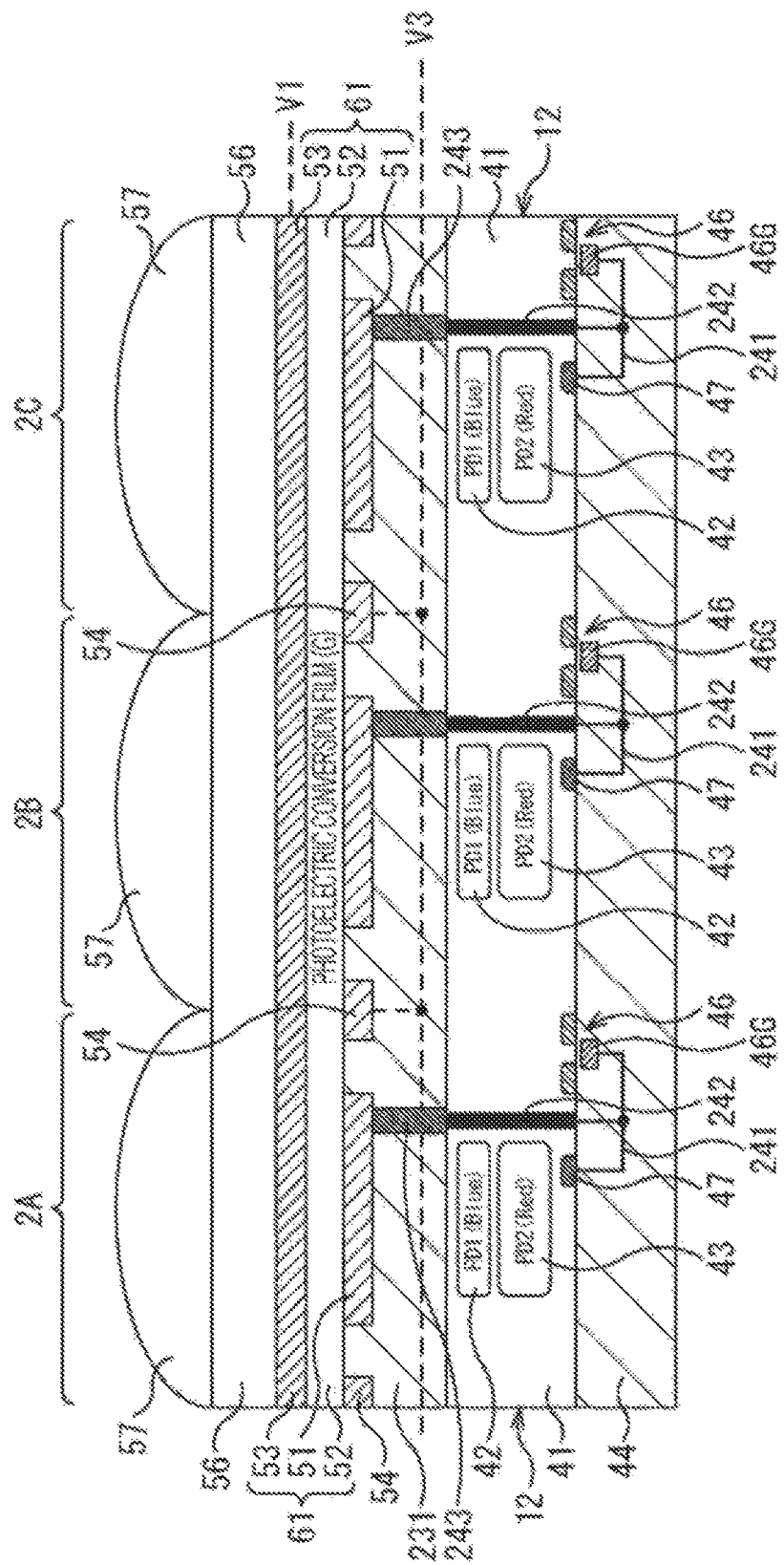

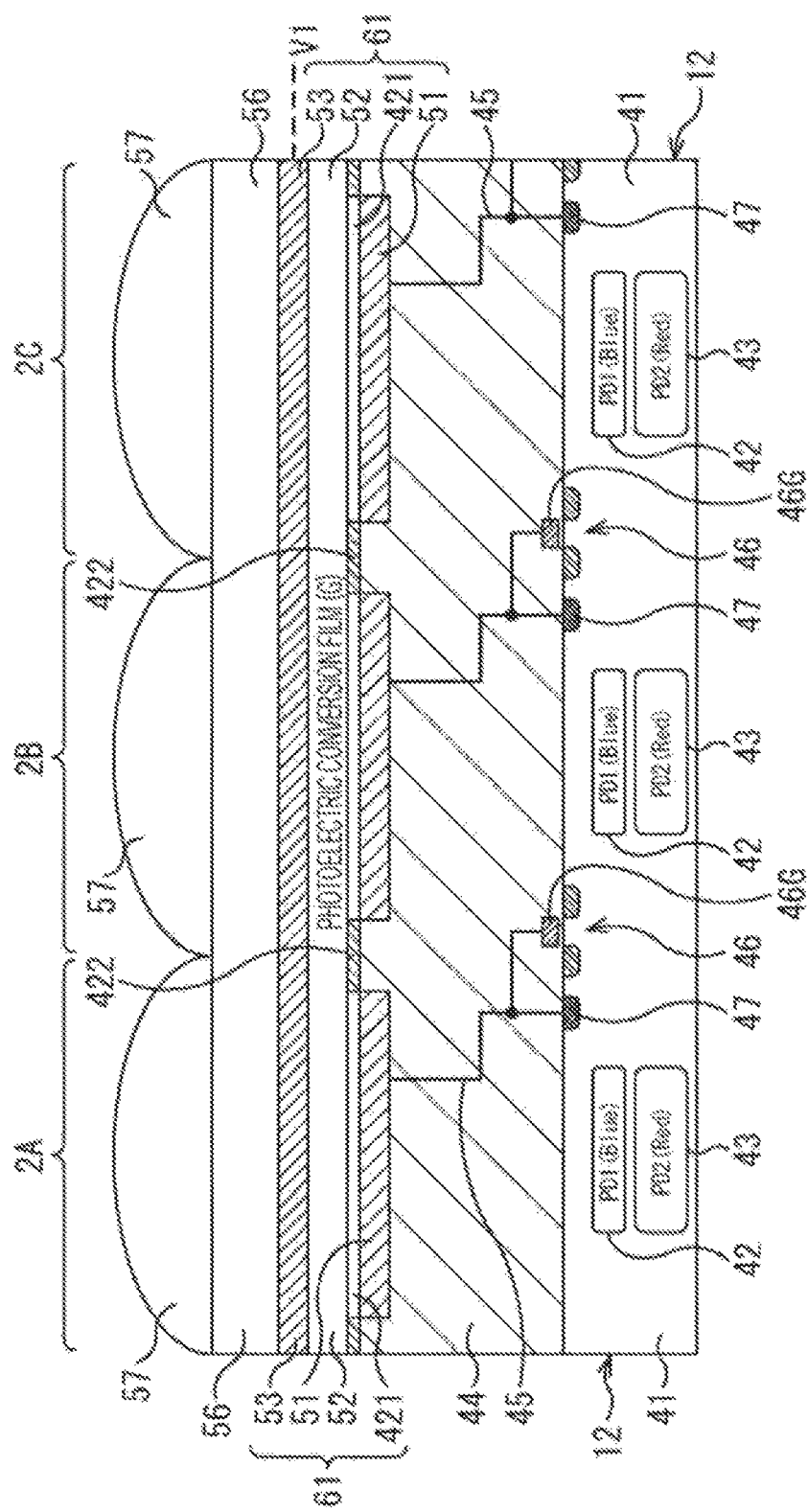

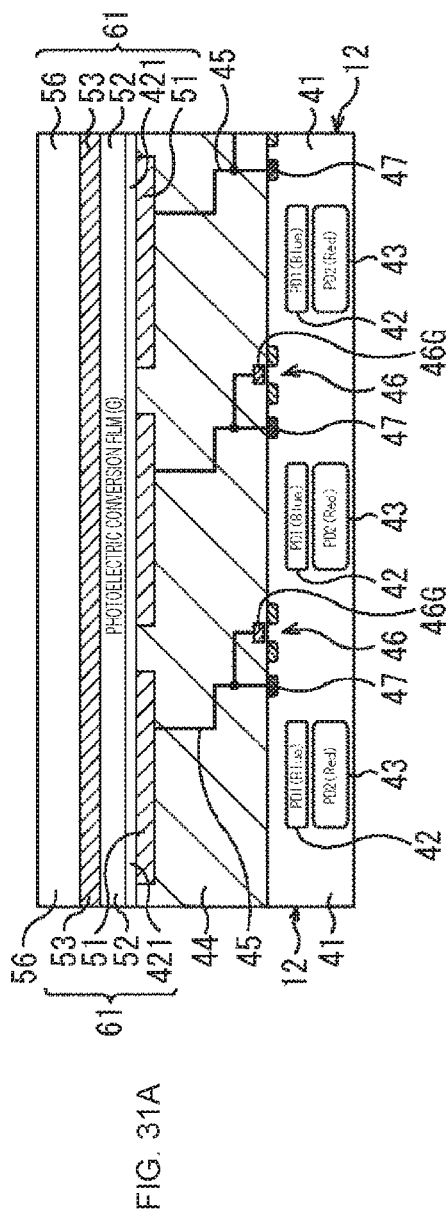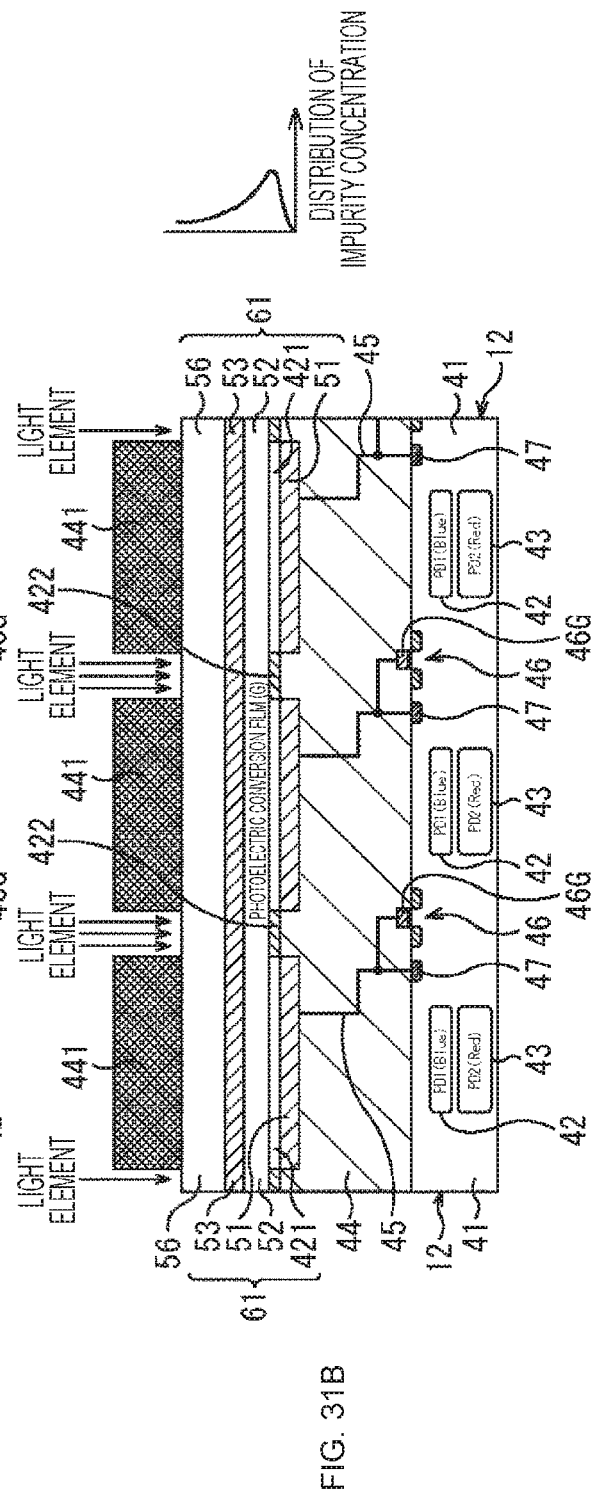

SOLID STATE IMAGE SENSOR PIXEL ELECTRODE BELOW A PHOTOELECTRONIC CONVERSION FILM

CROSS REFERENCE TO RELATED APPLICATIONS

This application is a U.S. National Phase of International Patent Application No. PCT/JP2015/084761 filed on Dec. 11, 2015, which claims priority benefit of Japanese Patent Application No. JP 2014-264288 filed in the Japan Patent Office on Dec. 26, 2014, and also claims priority benefit of Japanese Patent Application No. JP 2015-204246 filed in the Japan Patent Office on Oct. 16, 2015 Each of the above-referenced applications is hereby incorporated herein by reference in its entirety.

TECHNICAL FIELD

The present disclosure relates to a solid state image sensor, a method for manufacturing the same, and an electronic device, and particularly to a solid state image sensor capable of reducing signal mixture due to electric capacitive coupling between adjacent pixels, a method for manufacturing the same, and an electronic device.

BACKGROUND ART

In recent years, there have been developed image sensors using organic semiconductor or inorganic compound semiconductor as photoelectric conversion film. The image sensors are generally configured of a photoelectric conversion film and electrodes vertically sandwiching the same, and has a device structure in which at least one of the upper and lower electrodes is separated per pixel (see Patent Document 1, for example).

Charges generated by the photoelectric conversion film are accumulated in a charge accumulation unit in silicon connected to the separated electrode. A signal depending on the accumulated charges is then read to the outside by a signal reading unit such as MOS circuit.

CITATION LIST

Patent Document

Patent Document 1: Japanese Patent Application Laid-Open No. 2011-244010

SUMMARY OF THE INVENTION

Problems to be Solved by the Invention

The charge accumulation unit in each pixel is at a potential depending on the charges accumulated therein, but when a potential difference is large for the charge accumulation unit in a surrounding pixel, signal mixture occurs due to electric capacitive coupling. The signal mixture due to electric capacitive coupling causes a reduction in resolution, or color mixture.

The present disclosure has been made in terms of the situation, and is directed for reducing signal mixture due to electric capacitive coupling between adjacent pixels.

Solutions to Problems

A solid state image sensor according to a first aspect of the present disclosure including,
a first pixel and a second pixel adjacently arranged,
each of the first pixel and the second pixel having a photoelectric conversion film for photoelectrically converting an incident light, and a lower electrode arranged below the photoelectric conversion film, and
another electrode different from the lower electrodes is provided between the lower electrodes of the first pixel and the second pixel.

With a method for manufacturing a solid state image sensor according to a second aspect of the present disclosure, a photoelectric conversion film for photoelectrically converting an incident light and a lower electrode arranged below the photoelectric conversion film are formed as part of each of a first pixel and a second pixel which are adjacently arranged, and another electrode different from the lower electrodes is formed between the lower electrodes of the first pixel and the second pixel.

An electronic device according to a third aspect of the present disclosure includes a solid state image sensor including, a first pixel and a second pixel arranged adjacently, each of the first pixel and the second pixel having a photoelectric conversion film for photoelectrically conversing an incident light, and a lower electrode arranged below the photoelectric conversion film, and another electrode different from the lower electrodes is provided between the lower electrodes of the first pixel and the second pixel.

According to the first to third aspects of the present disclosure, a first pixel and a second pixel are adjacently arranged, each of the first pixel and the second pixel has a photoelectric conversion film for photoelectrically converting an incident light, and a lower electrode arranged below the photoelectric conversion film, and another electrode different from the lower electrodes is provided between the lower electrodes of the first pixel and the second pixel.

A solid state image sensor according to a fourth aspect of the present disclosure includes, a first pixel and a second pixel arranged adjacently, each of the first pixel and the second pixel having a photoelectric conversion film for photoelectrically converting an incident light, a buffer layer, and a lower electrode arranged below the photoelectric conversion film and the buffer layer, and an insulative blocking layer provided between the lower electrodes of the first pixel and the second pixel in the same layer as the buffer layer.

According to the fourth aspect of the present disclosure, a first pixel and a second pixel are adjacently arranged, each of the first pixel and the second pixel has a photoelectric conversion film for photoelectrically converting an incident light, a buffer layer, and a lower electrode arranged below the photoelectric conversion film and the buffer layer, and an insulative blocking layer is provided between the lower electrodes of the first pixel and the second pixel in the same layer as the buffer layer.

A solid state image sensor and an electronic device may be independent apparatuses, or may be modules incorporated in other apparatus.

Effects of the Invention

According to the first to fourth aspects of the present disclosure, it is possible to reduce signal mixture due to electric capacitive coupling between adjacent pixels.

Additionally, the effects described herein are not necessarily limited, and any effect described in the present disclosure may be obtained.

BRIEF DESCRIPTION OF DRAWINGS

FIG. 19 is a cross-section configuration diagram of pixels according to an eighth embodiment.

FIG. 30 is a cross-section configuration diagram of pixels according to a 13th embodiment.

FIGS. 31A and 31B are diagrams for explaining a manufacture method according to the 13th embodiment.

MODE FOR CARRYING OUT THE INVENTION

The modes for accomplishing the present disclosure (which will be called embodiments below) will be described below. Additionally, the description will be made in the following order.

1. Exemplary schematic configuration of solid state image sensor
2. First embodiment of pixels (configuration having inter-pixel electrodes)
3. Second embodiment of pixels (configuration in which inter-pixel electrodes are connected to GND regions)
4. Third embodiment of pixels (configuration in which inter-pixel electrodes are connected to wiring layers in pixels)
5. Fourth embodiment of pixels (configuration in which insulative film is not flattened)
6. Fifth embodiment of pixels (configuration in which inter-pixel electrodes do not contact photoelectric conversion film)
7. Sixth embodiment of pixels (configuration in which charges of inter-pixel electrodes are accumulated)
8. Seventh embodiment of pixels (configuration in which photoelectric conversion film photoelectrically converts lights of all wavelengths)
9. Manufacture method according to first embodiment
10. Eighth embodiment of pixels (configuration of backside irradiation type)
11. Ninth embodiment of pixels (first exemplary configuration in which inter-pixel electrodes are formed in lower layer than lower electrodes)
12. 10th embodiment of pixels (second exemplary configuration in which inter-pixel electrodes are formed in lower layer than lower electrodes)
13. 11th embodiment of pixels (third exemplary configuration in which inter-pixel electrodes are formed in lower layer than lower electrodes)
14. 12th embodiment of pixels (fourth exemplary configuration in which inter-pixel electrodes are formed in lower layer than lower electrodes)
15. 13th embodiment of pixels (exemplary configuration in which photoelectric conversion unit has buffer layer and blocking layer)
16. Exemplary application to electronic devices <1. Exemplary Schematic Configuration of Solid State Image Sensor>

Figure 1:
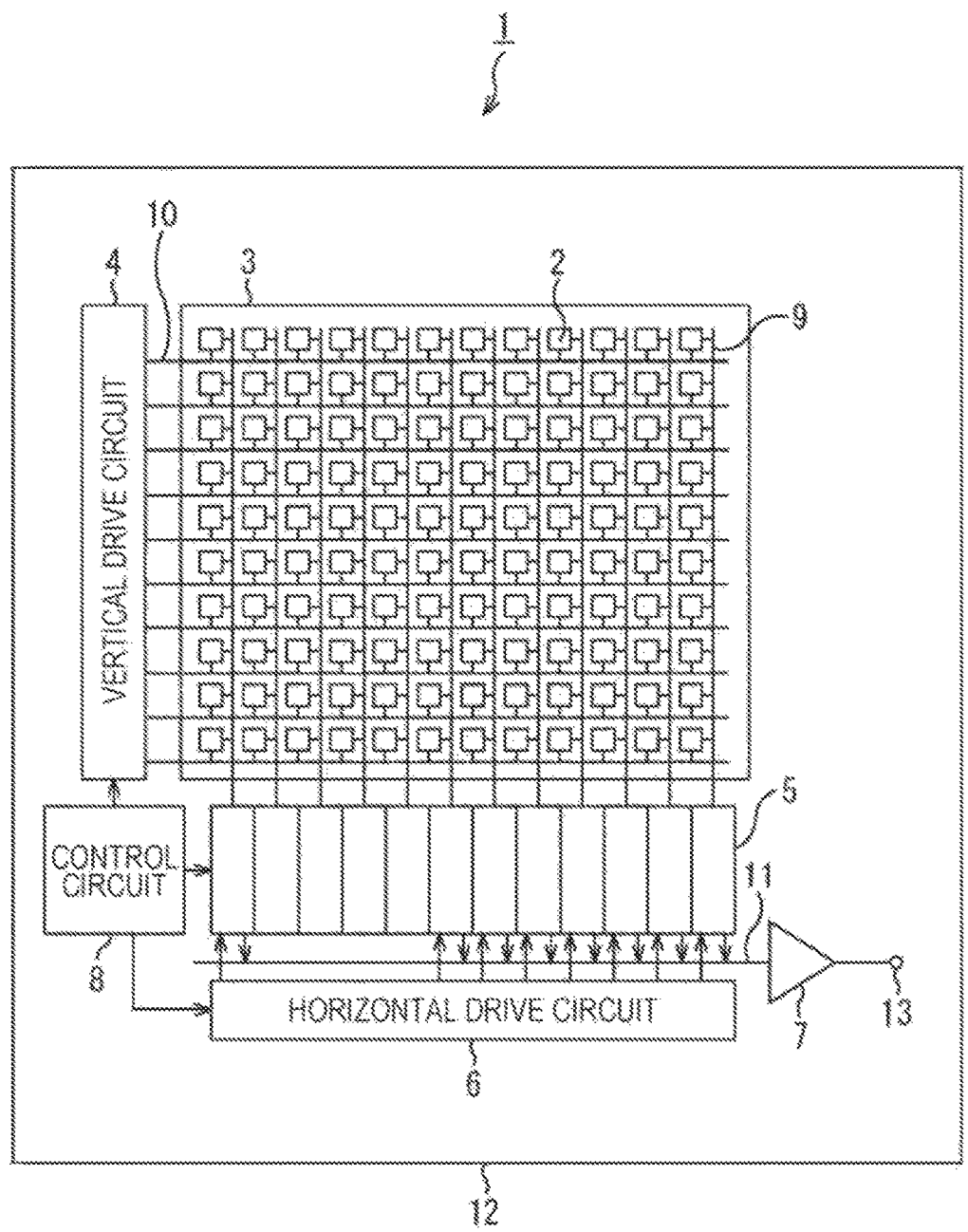
FIG. 1 is a diagram illustrating a schematic configuration of a solid state image sensor according to the present disclosure.

FIG. 1 illustrates a schematic configuration of a solid state image sensor according to the present disclosure.

A solid state image sensor 1 of FIG. 1 is configured such that a semiconductor substrate 12 using silicon (Si) as semiconductor, for example, is provided with a pixel array part 3 in which pixels 2 are two-dimensionally arranged in a matrix shape, and surrounding circuit units thereof. The surrounding circuit units include a vertical drive circuit 4, column signal processing circuits 5, a horizontal drive circuit 6, an output circuit 7, and a control circuit 8.

A pixel 2 has a photoelectric conversion element and a plurality of pixel transistors. The pixel transistors are configured of three MOS transistors of selective transistor, reset transistor and output transistor (amplification transistor), for example.

The vertical drive circuit 4 is configured of a shift register, for example, selects a pixel drive wiring 10, supplies the selected pixel drive wiring 10 with a pulse for driving the pixel 2, and drives the pixels 2 in units of row. That is, the vertical drive circuit 4 sequentially selects and scans the pixels 2 in the pixel array part 3 in units of row, and supplies a pixel signal based on a charge (signal charge) generated depending on the mount of received light in the photoelectric conversion unit in each pixel 2 to a column signal processing circuit 5 via a vertical signal line 9.

The column signal processing circuits 5 are arranged per column of the pixels 2, and perform a signal processing such as noise cancellation on signals output from one row of pixels 2 per column of the pixels. For example, the column signal processing circuits 5 perform a signal processing such as correlated double sampling (CDS) and AD conversion for canceling a fixed pattern noise specific to the pixels.

The horizontal drive circuit 6 is configured of a shift register, for example, sequentially outputs a horizontal scan pulse thereby to sequentially select each of the column signal processing circuits 5, and outputs a pixel signal from each of the column signal processing circuits 5 to a horizontal signal line 11.

The output circuit 7 performs a predetermined signal processing on the signals sequentially supplied from each of the column signal processing circuits 5 via the horizontal signal line 11, and outputs the processed signals via an output terminal 13. The output circuit 7 may only buffer, for example, or may perform various digital signal processings such as black level adjustment or column variation correction.

The control circuit 8 receives an input clock and data for instructing an operation mode and the like, and outputs data such as internal information of the solid state image sensor 1. That is, the control circuit 8 generates a clock signal or control signal which is a reference of the operations of the vertical drive circuit 4, the column signal processing circuits 5, and the horizontal drive circuit 6 on the basis of a vertical synchronization signal, a horizontal synchronization signal, and a master clock. The control circuit 8 then outputs the generated clock signal or control signal to the vertical drive circuit 4, the column signal processing circuits 5, and the horizontal drive circuit 6.

The thus-configured solid state image sensor 1 is a CMOS image sensor called column AD system in which the column signal processing circuits 5 for performing a CDS processing and an AD conversion processing are arranged per column of the pixels.

<2. First Embodiment of Pixels>
<Cross-Section Configuration Diagram of Pixels>

A first embodiment of the pixels 2 in the solid state image sensor 1 of FIG. 1 will be described with reference to FIG. 2.

Figure 2:
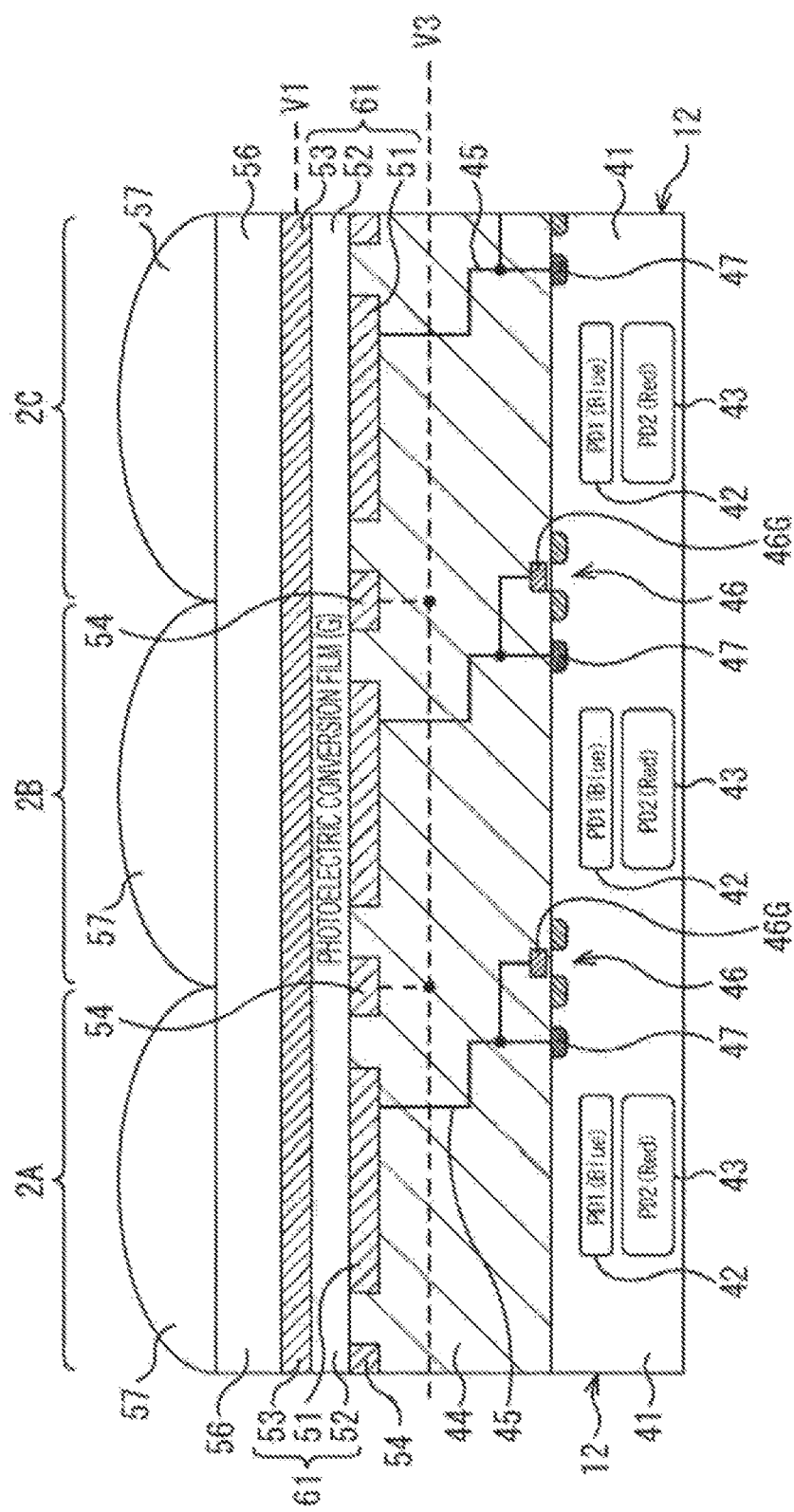
FIG. 2 is a cross-section configuration diagram of pixels according to a first embodiment.

FIG. 2 is a diagram illustrating a cross-section configuration of the pixels 2 according to the first embodiment.

Additionally, in FIG. 2, three pixels 2 are laterally arranged, and the three pixels 2 are indicated as pixel 2A, pixel 2B, and pixel 2C from the left side in the Figure for convenience.

Semiconductor regions 42 and 43 of second conductive type (such as N type) are accumulated in the depth direction to be formed in a semiconductor region 41 of first conductive type (such as P type) of the semiconductor substrate 12 so that photodiodes PD1 and PD2 by PN junction are formed in the depth direction. The photodiode PD1 using the semiconductor region 42 as charge accumulation region is an inorganic photoelectric conversion unit for receiving and photoelectrically converting a blue light, and the photodiode PD2 using the semiconductor region 43 as charge accumulation region is an inorganic photoelectric conversion unit for receiving and photoelectrically converting a red light.

A multilayered wiring layer 44 formed of a plurality of wiring layers and interlayer insulative films is formed on the surface (on the upper side in the Figure) of the semiconductor substrate 12. The interlayer insulative films in the multilayered wiring layer 44 are made of a transparent insulative film such as hafnium oxide (HfO2) film, silicon oxide film, or silicon nitride film.

A photoelectric conversion film 52 is arranged to be sandwiched between lower electrodes 51 on its lower side and an upper electrode 53 on its upper side over the multilayered wiring layer 44. The regions sandwiched by the lower electrodes 51 and the upper electrode 53 in the region in which the photoelectric conversion film 52 is formed are where an incident light is photoelectrically converted, and the lower electrodes 51, the photoelectric conversion film 52, and the upper electrode 53 configure a photoelectric conversion unit 61. The photoelectric conversion film 52 as film for photoelectrically converting a green wavelength light is made of an organic photoelectric conversion material containing rhodamine-based pigment, merocyanine-based pigment or quinacridone. The lower electrodes 51 and the upper electrode 53 are made of an indium tin oxide (ITO) film, an indium zinc oxide film, or the like, for example.

Additionally, when being to be a film for photoelectrically converting a red wavelength light, the photoelectric conversion film 52 may use an organic photoelectric conversion material containing phthalocyanine-based pigment, for example. Further, when being to be a film for photoelectrically converting a blue wavelength light, the photoelectric conversion film 52 may use an organic photoelectric conversion material containing coumarin-based pigment, tris-8-hydroxyquinoline Al (Alq3), merocyanine-based pigment, or the like.

The upper electrode 53 is commonly formed on the whole surfaces of all the pixels while the lower electrodes 51 are formed in units of pixel. In addition, an inter-pixel electrode 54 which is different from the lower electrodes 51 is formed between the lower electrodes 51 separated per pixel. Here, assuming the upper electrode 53 as first electrode and the lower electrode 51 as second electrode, the inter-pixel electrode 54 is a third electrode.

According to the present embodiment, the inter-pixel electrodes 54 are assumed to be made of the same material as the lower electrodes 51, and may be made of a metal material such as tungsten (W), aluminum (Al), or copper (Cu).

Figure 3:
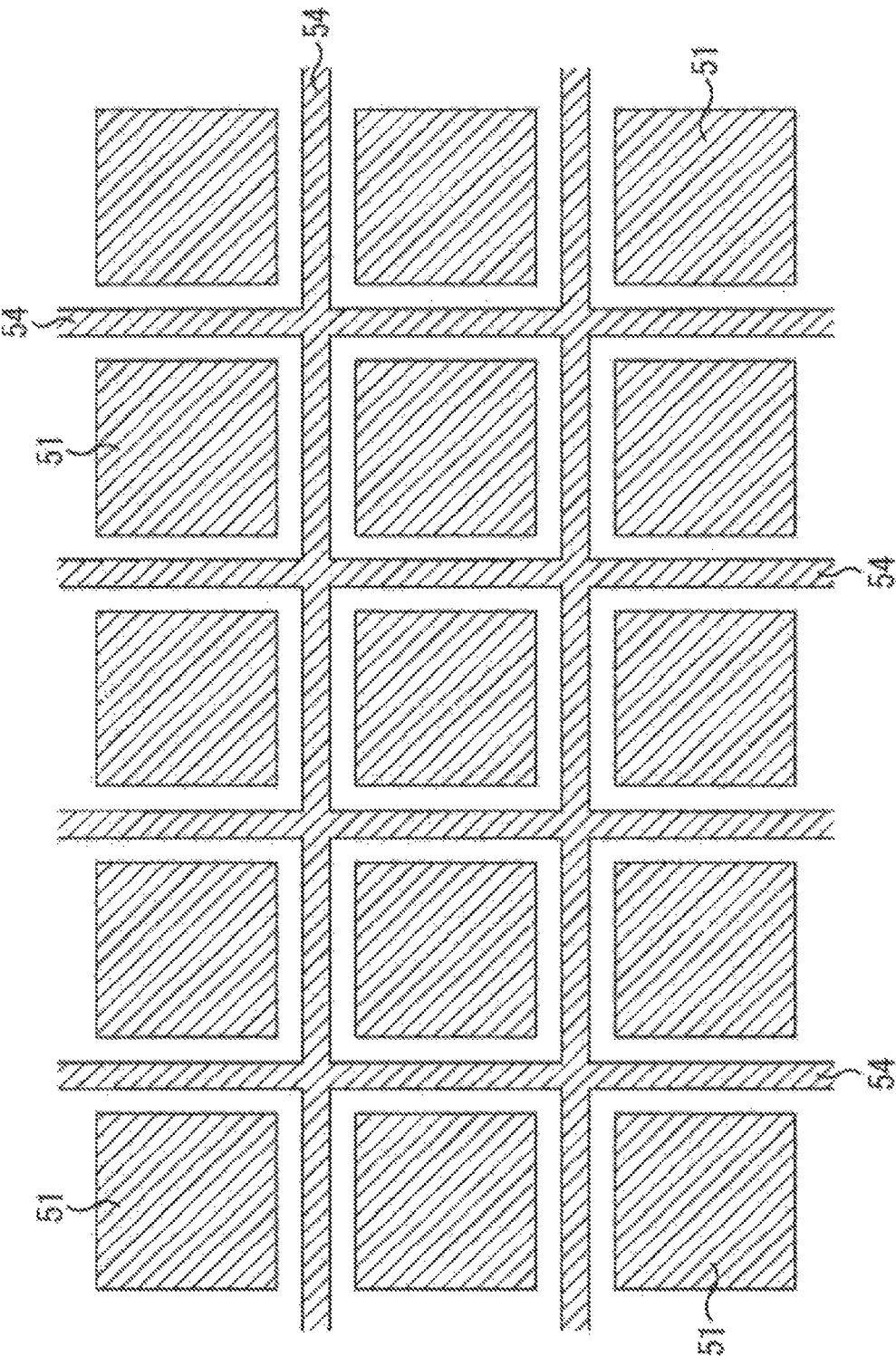
FIG. 3 is a diagram illustrating a plane layout of lower electrodes and inter-pixel electrodes.

FIG. 3 is a diagram illustrating a plane layout of the lower electrodes 51 and the inter-pixel electrodes 54 in the pixel array part 3.

As illustrated in FIG. 3, the rectangular lower electrodes 51 formed in units of pixel are two-dimensionally arranged in association with the arrangement of the pixels 2.

On the other hand, the inter-pixel electrode 54 is formed at a predetermined pattern width in a grid shape between the adjacent lower electrodes 51 on the border between pixels 2.

The inter-pixel electrode 54 is connected to a wiring layer (not illustrated) around the pixel array part 3, and the inter-pixel electrode 54 is supplied with a predetermined voltage V3 via the wiring layer. FIG. 2 illustrates a state in which the vertical drive circuit 4 or the control circuit 8 supplies the inter-pixel electrodes 54 with voltage V3 via the wiring layers around the pixel array part 3 in a dashed line.

Returning to FIG. 2, the inter-pixel electrodes 54 are supplied with the predetermined voltage V3 from the wiring layers around the pixel array part 3, and the upper electrode 53 as first electrode are supplied with a predetermined voltage V1 from the wiring layers around the pixel array part 3. At this time, a relationship between voltage V1 and voltage V3 is V1>V3 when a signal charge generated depending on an incident light in the photoelectric conversion unit 61 is a hole, and V1<V3 when a generated signal charge is an electron.

A lower electrode 51 is connected to a gate electrode 46G of an output transistor 46, and a floating diffusion (FD) unit 47 in the semiconductor substrate 12 via a metal wiring 45 formed in the multilayered wiring layer 44. The output transistor (amplification transistor) 46 is an output transistor for outputting a charge generated by the photoelectric conversion unit 61 as pixel signal to the outside of the pixel. The FD unit 47 is a region for temporarily holding a charge generated by the photoelectric conversion film 52 until the charge is read. The FD unit 47 is formed of a semiconductor region of second conductive type (such as N type), for example.

Additionally, a plurality of pixel transistors for reading the charges generated by the photodiodes PD1 and PD2, the FD unit, and the like are formed in the multilayered wiring layer 44 and the semiconductor region 41 in the semiconductor substrate 12, but the illustration thereof is omitted.

A high refractive index layer 56 made of an inorganic film such as silicon nitride film (SiN), silicon oxynitride film (SiON), or silicon carbide (SiC) is formed on top of the upper electrode 53. On-chip lenses 57 are formed on the high refractive index layer 56. A material of the on-chip lenses 57 employs a silicon nitride film (SiN), or a resin-based material such as styrene-based resin, acryl-based resin, styrene-acryl copolymer-based resin, or siloxane-based resin, for example. The high refractive index layer 56 has an effect of increasing a refractive angle and enhancing a focusing efficiency.

The solid state image sensor 1 having the above pixel structure is of a longitudinally spectroscopic type in which a green light is photoelectrically converted by the photoelectric conversion film 52 formed above the semiconductor substrate (silicon layer) 12 and a blue light and a red light are photoelectrically converted by the photodiodes PD1 and PD2 in the semiconductor substrate 12.

Further, the solid state image sensor 1 is a CMOS solid state image sensor of surface irradiation type in which alight is incident from the surface of the semiconductor substrate 12 forming the multilayered wiring layer 44 thereon.

<Exemplary Circuit Configuration of Photoelectric Conversion Film>

Figure 4:
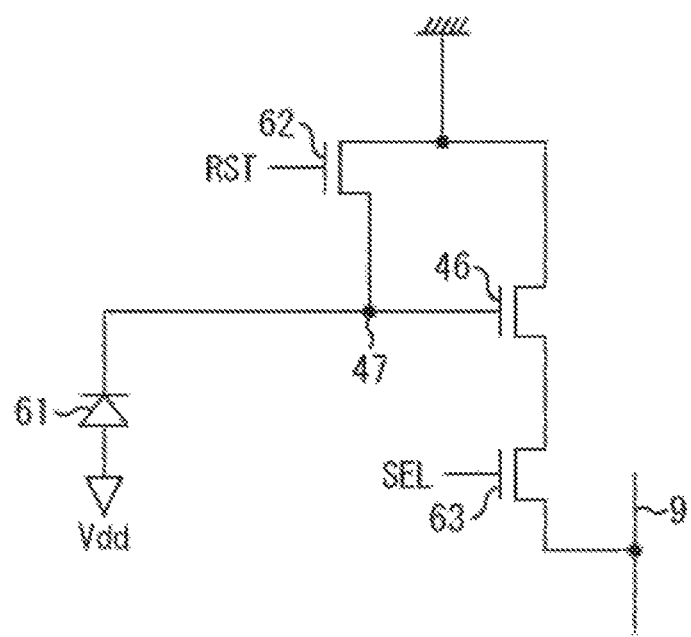
FIG. 4 is a diagram illustrating a circuit configuration of a photoelectric conversion film.

FIG. 4 illustrates an exemplary circuit configuration of apart for outputting the charges photoelectrically converted by the photoelectric conversion film 52 in a pixel 2.

A pixel 2 has the output transistor 46, the FD unit 47, the photoelectric conversion unit 61, are set transistor 62, and a selective transistor 63.

The photoelectric conversion unit 61 is configured of the lower electrode 51, the photoelectric conversion film 52, and the upper electrode 53 illustrated in FIG. 2, and generates and accumulates a charge (signal charge) depending on the amount of received light. As illustrated in FIG. 2, the lower electrode 51 as part of the photoelectric conversion unit 61 is connected to the FD unit 47 and the gate electrode 46G of the output transistor 46. Therefore, the charges generated by the photoelectric conversion film 52 are held in all of the lower electrode 51, the FD unit 47, and the gate electrode 46G of the output transistor 46. The lower electrode 51, the FD unit 47, and the gate electrode 46G of the output transistor 46 will be also referred to as charge accumulation unit below.

The FD unit 47 accumulates the charges generated by the photoelectric conversion unit 61 therein. When the reset transistor 62 is turned on by a reset signal RST, the charges accumulated in the FD unit 47 are discharged to a source (such as GND) so that the reset transistor 62 resets a potential of the FD unit 47.

The output transistor 46 outputs a pixel signal depending on the potential of the FD unit 47. That is, the output transistor 46 configures a load MOS (not illustrated) as constant current source, and a source follower circuit which are connected via the vertical signal line 9, and a pixel signal indicating a level depending on the charges accumulated in the FD unit 47 and the like is output from the output transistor 46 to a column signal processing circuit 5 (FIG. 1) via the selective transistor 63.

When a pixel 2 is selected by a selection signal SEL, the selective transistor 63 is turned on, and outputs a pixel signal of the pixel 2 to a column signal processing circuit 5 via a vertical signal line 9. Each signal line in which the selection signal SEL and the reset signal RST are transmitted corresponds to a pixel drive wiring 10 in FIG. 1.

As described above, when photoelectrical conversion is performed by the photoelectric conversion film 52, the generated charges are accumulated in all of the lower electrode 51, the FD unit 47, and the gate electrode 46G of the output transistor 46, and thus a transfer transistor is not required. Further, if only the lower electrode 51 and the gate electrode 46G of the output transistor 46 can accumulate the generated charges, the FD unit 47 can be omitted.

A pixel 2 includes the photodiodes PD1 and PD2, and the read circuits thereof in addition to the above components.

The operations of each pixel 2 in the solid state image sensor 1 will be described below with reference to FIG. 2 again.

The charge accumulation unit in each pixel 2 is at a potential based on the charges generated depending on the amount of light incident into the pixel. Here, when different amounts of light are incident into the pixel 2A and the pixel 2B, a large potential difference is caused between voltage $V_A$ of the charge accumulation unit in the pixel 2A and voltage $V_B$ of the charge accumulation unit in the adjacent pixel 2B. If an inter-pixel electrode 54 is not provided, signal mixture is caused due to electric capacitive coupling between the charge accumulation unit in the pixel 2A and the charge accumulation unit in the pixel 2B.

To the contrary, an inter-pixel electrode 54 is provided between the lower electrode 51 in the pixel 2A and the lower electrode 51 in the pixel 2B and voltage V3 is applied to the inter-pixel electrode 54 according to the present embodiment, and thus the inter-pixel electrode 54 between the pixel 2A and the pixel 2B works to shield the capacitive coupling between the charge accumulation units in the pixel 2A and the pixel 2B. Thereby, voltage $V_A$ of the charge accumulation unit in the pixel 2A and voltage $V_B$ of the charge accumulation unit in the pixel 2B are kept, respectively, thereby acquiring an imaging signal excellent in spatial resolution and color separation.

There will be described below a case in which photoelectric conversion continues for a long time or a case in which a large amount of light is incident into the pixel 2A and the pixel 2B.

Assuming open voltage $V_{OC}$ of the photoelectric conversion film 52, when photoelectric conversion continues for a long time or when a large amount of light is incident into the pixel 2A and the pixel 2B, if an inter-pixel electrode 54 is not provided, potential $V_A$ of the charge accumulation unit in the pixel 2A and potential $V_B$ of the charge accumulation unit in the pixel 2B take a value of Vmax=V1+$V_{OC}$ in which open voltage $V_{OC}$ is added to voltage V3 applied to the upper electrode 53. Thereby, potential Vmax is applied to the gate electrode 46G of the output transistor 46. A common means is to increase voltage V1 to be applied to the upper electrode 53 in order to improve the characteristic of the photoelectric conversion film 52, but when voltage V1 is increased, the value of Vmax also increases, and thus a strong electric field is applied to the charge accumulation unit or the gate insulative film of the output transistor 46, which causes a problem of reliability or an increase in white points.

To the contrary, in a case in which an inter-pixel electrode 54 is provided between the lower electrode 51 of the pixel 2A and the lower electrode 51 of the pixel 2B as in the present pixel structure, when a voltage difference of $|V_A-V3|$ between potential $V_A$ of the charge accumulation unit in the pixel 2A and voltage V3 of the inter-pixel electrode 54 takes a predetermined value or more, leak current flows from the lower electrode 51 to the inter-pixel electrode 54. Consequently, potential $V_A$ of the charge accumulation unit in the pixel 2A can be restricted to be lower than Vmax. Thereby, voltage V1 to be applied to the upper electrode 53 can be increased without limit, thereby achieving an improvement in the characteristic of the photoelectric conversion film 52.

Further, according to the present pixel structure, a carrier ratio of $M=N_1/N_3$ of the number of charges (the number of carriers) $N_1$ captured in the lower electrode 51 of the pixel 2A and the number of charges (the number of carriers) $N_3$ captured in the inter-pixel electrode 54 can be controlled by voltage V3 to be applied to the inter-pixel electrode 54. Specifically, when voltage V3 to be applied to the inter-pixel electrode 54 is set for voltage $V_A$ of the charge accumulation unit in the pixel 2A to be $|V1-V_A|>|V3|V_A|$, the ratio M can be increased, and when voltage V3 to be applied to the inter-pixel electrode 54 is set at $|V1<|V3-V_A|$, the carrier ratio M can be decreased. The fact means that voltage V3 to be applied to the inter-pixel electrode 54 is controlled depending on the amount of light thereby to control sensitivity of the pixel 2A.

Figure 5:
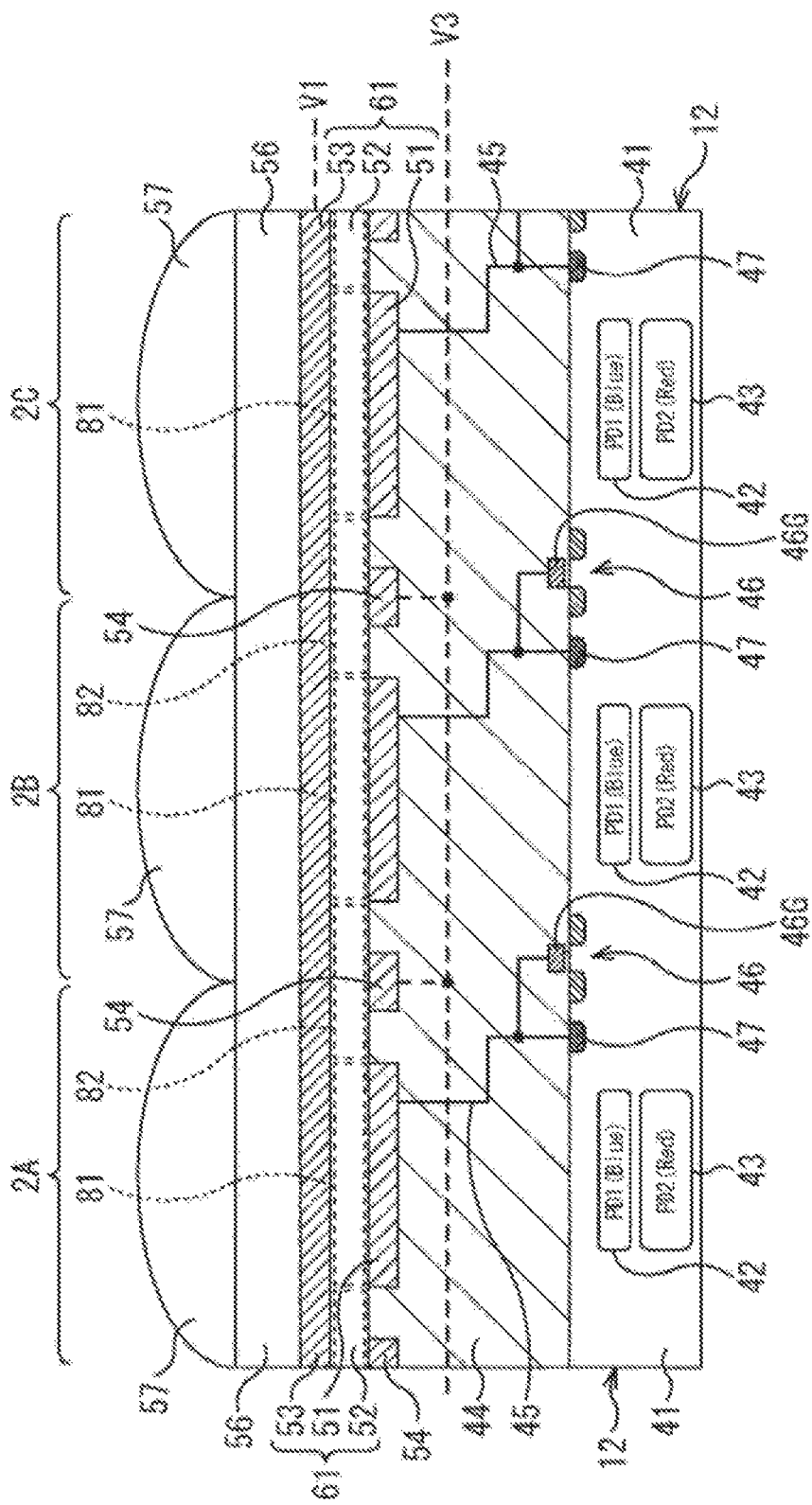
FIG. 5 is a diagram for explaining an effect of the pixels according to the first embodiment.

FIG. 5 illustrates that the region of the photoelectric conversion film 52 is divided into regions 81 sandwiched between the lower electrodes 51 and the upper electrode 53 and regions 82 without the lower electrodes 51. Even when the inter-pixel electrodes 54 are not arranged, a charge is slightly generated in the regions 82. At this time, the electric filed intensity of the region 82 without the lower electrode 51 is weaker than the electric field intensity of the region 81 with the lower electrode 51, and thus a charge generated in the region 82 works as a delay charge to be an afterimage, which is problematic in shooting a moving object.

To the contrary, when an inter-pixel electrode 54 is provided between the lower electrodes 51 in adjacent pixels 2 as in the present pixel structure, charges generated in the region 82 without a lower electrode 51 can be extracted as unrequired charges from the inter-pixel electrode 54, thereby restricting an afterimage.

Further, the present pixel structure is advantageous in that voltage V1 to be applied to the upper electrode 53 is controlled thereby to reset voltage $V_A$ of the charge accumulation unit in the pixel 2A.

That is, the reset transistor 62 is generally provided to reset voltage $V_A$ of the charge accumulation unit in the pixel 2A as described with reference to FIG. 4, but voltage V1 to be applied to the upper electrode 53 is controlled to generate leak, thereby resetting voltage $V_A$ of the charge accumulation unit in the pixel 2A at voltage V3 to be applied to the inter-pixel electrode 54.

Specifically, for example, when a signal charge is a hole, voltage V1 is applied to the upper electrode 53 and voltage V3 (V1>V3) is applied to the inter-pixel electrode 54. Here, for example, when the vertical drive circuit 4 sets voltage V1 to be supplied to the upper electrode 53 at a predetermined voltage or less, leak is caused between the lower electrode 51 and the inter-pixel electrode 54 and voltage $V_A$ of the charge accumulation unit in the pixel 2A is reset at voltage V3 to be applied to the inter-pixel electrode 54. When voltage V3 to be applied to the inter-pixel electrode 54 is GND, voltage $V_A$ can be reset at GND. In this case, the reset transistor 62 can be omitted.

As described above, the pixel structure of the solid state image sensor 1 according to the first embodiment enables signal mixture due to electric capacitive coupling between adjacent pixels to be reduced, and reliability or photoelectric conversion characteristic to be improved.

<Other Exemplary Layout of Inter-Pixel Electrodes>

Figure 6:
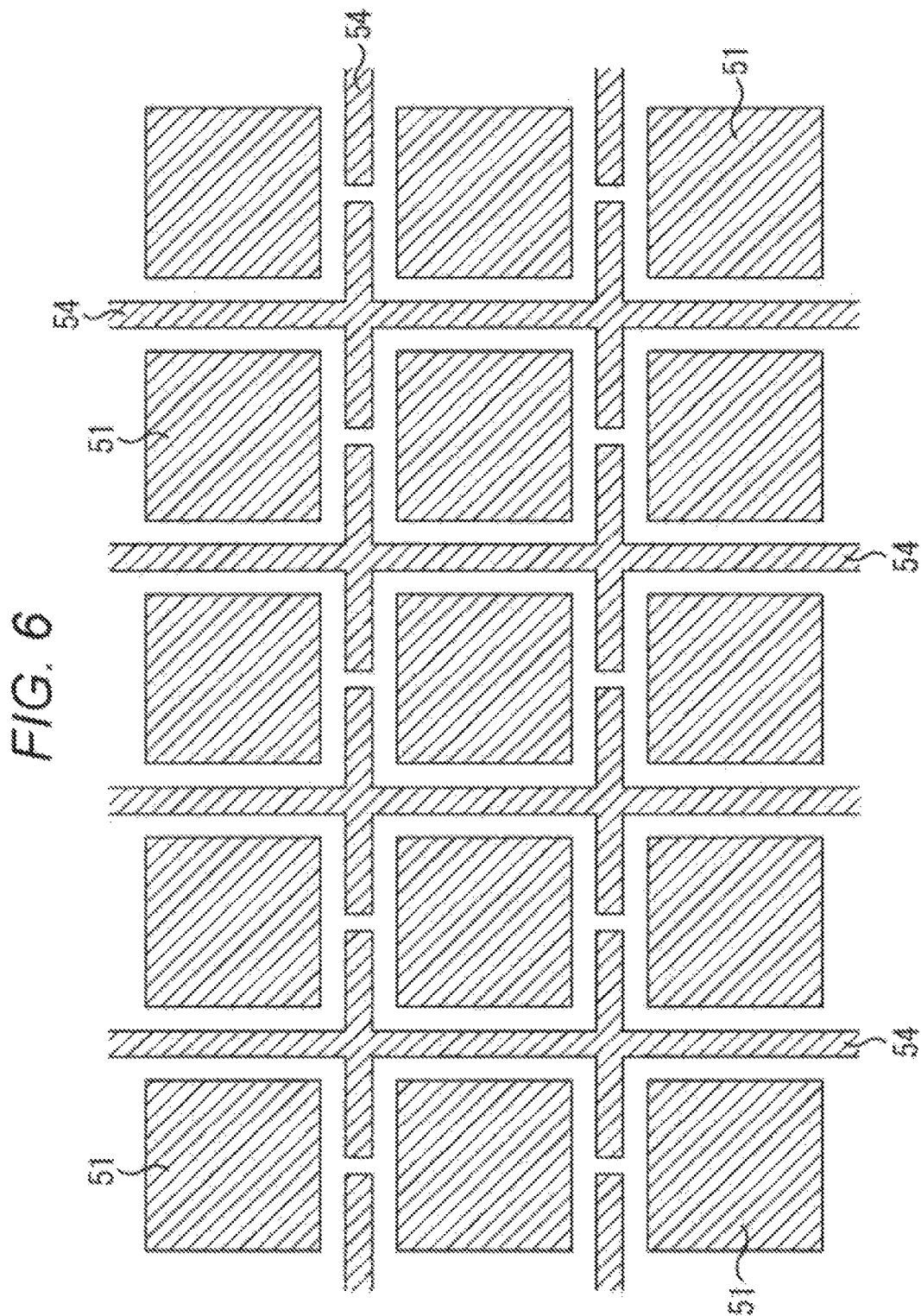
FIG. 6 is a diagram illustrating other exemplary layout of the inter-pixel electrodes.
Figure 7:
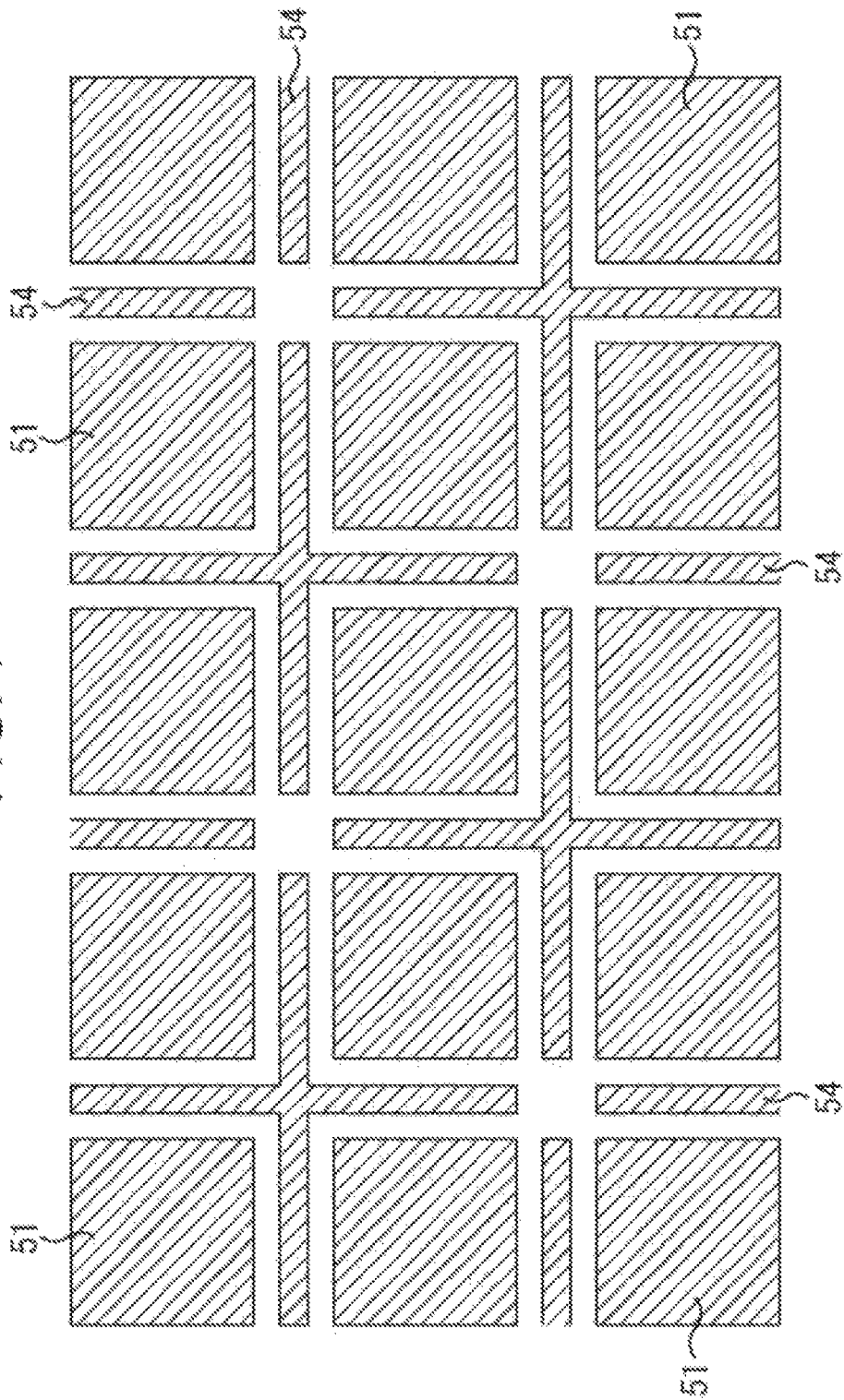
FIG. 7 is a diagram illustrating other exemplary layout of the inter-pixel electrodes.

FIG. 6 and FIG. 7 illustrate other exemplary layouts of the inter-pixel electrodes 54.

In the layout of the inter-pixel electrodes 54 illustrated in FIG. 3, the inter-pixel electrodes 54 are seamlessly formed in the horizontal direction and in the vertical direction.

However, the inter-pixel electrodes 54 may be formed to be separated at predetermined positions in the horizontal direction as illustrated in FIG. 6, for example. In the example in FIG. 6, the inter-pixel electrodes 54 are separated in units of column of pixel, but may be separated in units of column of pixels. Further, though not illustrated, the inter-pixel electrodes 54 may be separated at predetermined positions in the vertical direction in units of column of pixel or pixels.

Alternatively, as illustrated in FIG. 7, the cross parts of the inter-pixel electrodes 54 in a grid shape are omitted, and thus the inter-pixel electrodes 54 may be separated into a plurality of patterns in the pixel array part 3. The cross parts of the inter-pixel electrodes 54 in a grid shape are omitted every two pixels in the horizontal and vertical directions in the example of FIG. 7, but may be omitted at every three or more pixels, or every pixel.

<3. Second Embodiment of Pixels>
<Cross-Section Configuration Diagram of Pixels>

A second embodiment of the pixels 2 in the solid state image sensor 1 in FIG. 1 will be described below with reference to FIG. 8.

Figure 8:
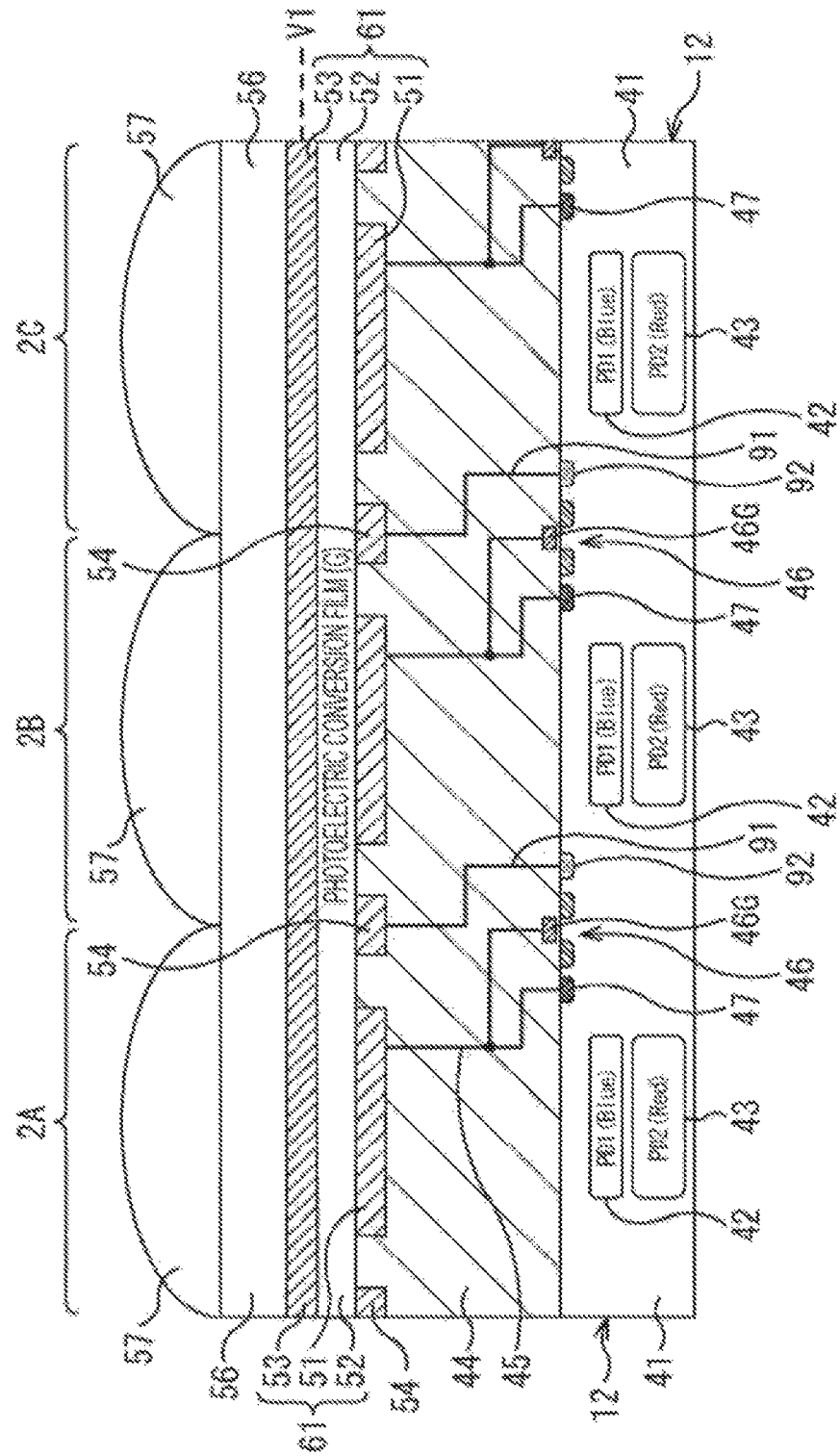
FIG. 8 is a cross-section configuration diagram of pixels according to a second embodiment.

FIG. 8 is a diagram illustrating a cross-section configuration of the pixels 2 according to the second embodiment.

Additionally, according to the second embodiment, the parts corresponding to those in the first embodiment are denoted with the same reference numerals, and the description thereof will be omitted. This is applicable to other embodiments described below.

The second embodiment is different from the first embodiment in that an inter-pixel electrode 54 is connected to a GND region 92 in the semiconductor region 41 via a metal wiring 91 formed in the multilayered wiring layer 44.

Also in this case, the solid state image sensor 1 has similar effects to those in the first embodiment. Additionally, The predetermined voltage V3 according to the first embodiment may be GND.

<4. Third Embodiment of Pixels>
<Cross-Section Configuration Diagram of Pixels>

A third embodiment of the pixels 2 in the solid state image sensor 1 in FIG. 1 will be described with reference to FIG. 9 and FIG. 10.

Figure 9:
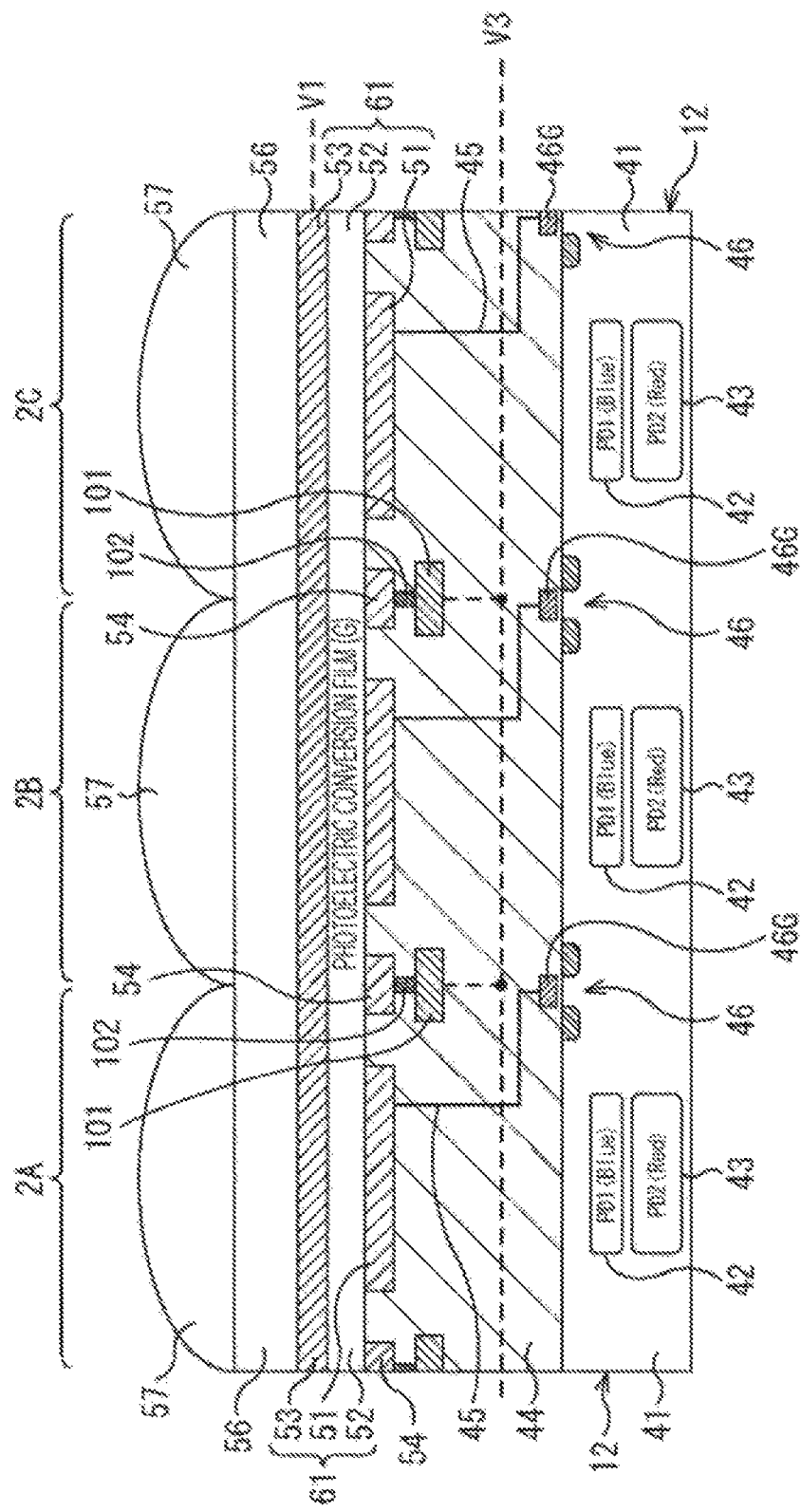
FIG. 9 is a cross-section configuration diagram of pixels according to a third embodiment.

FIG. 9 is a diagram illustrating a cross-section configuration of the pixels 2 according to the third embodiment.

According to the third embodiment, a wiring layer 101 is formed below an inter-pixel electrode 54 (closer to the semiconductor substrate 12), and the inter-pixel electrode 54 is connected to the wiring layer 101 via a contact via 102.

The inter-pixel electrode 54 is supplied with the predetermined voltage V3 via the wiring layer 101 and the contact via 102 similarly as in the first embodiment.

Figure 10:
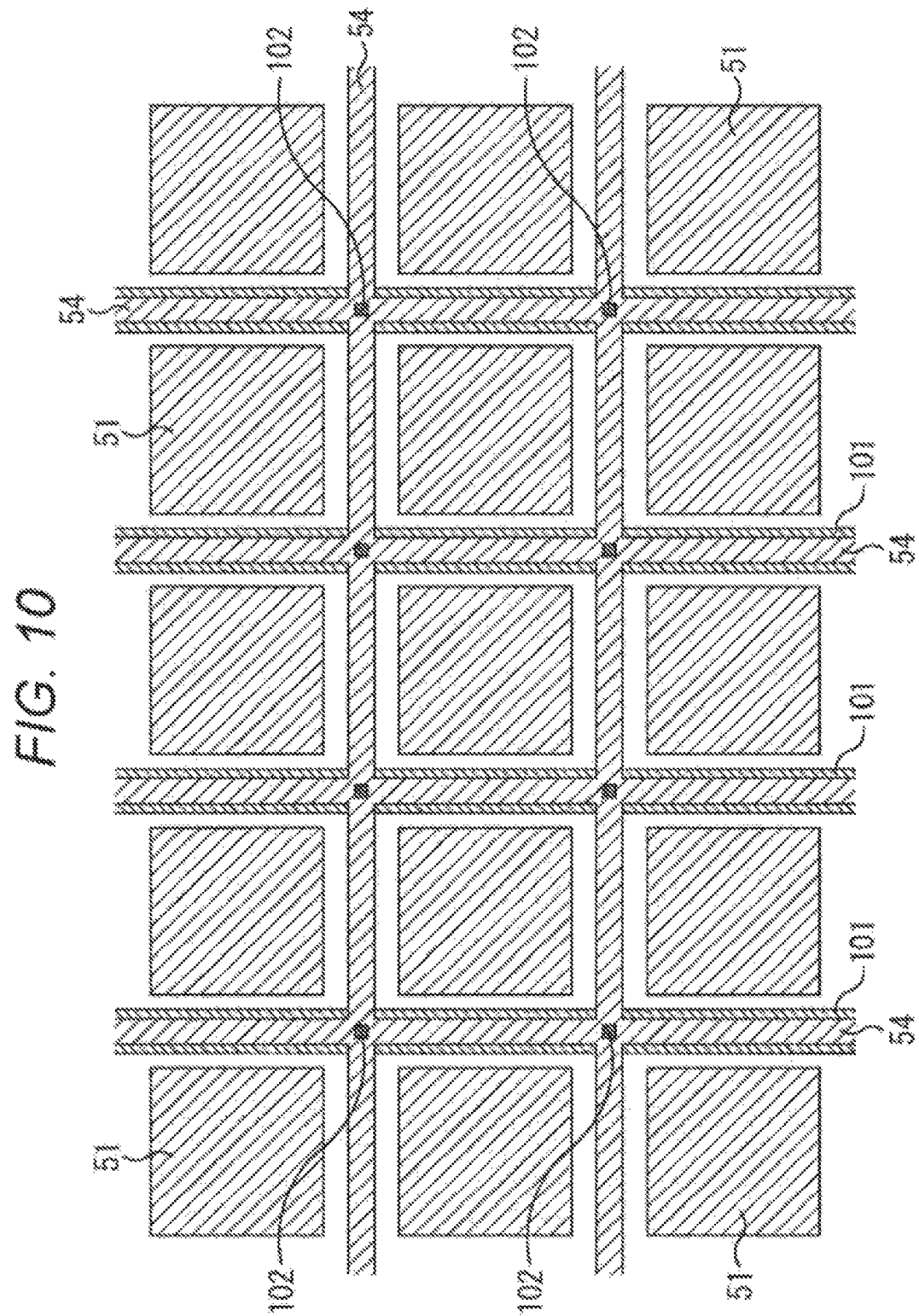
FIG. 10 is a diagram illustrating a plane layout of wiring layers and contact vias.

FIG. 10 is a plan view in which the wiring layers 101 and the contact vias 102 are overlapped on the layout of the lower electrodes 51 and the inter-pixel electrodes 54. Additionally, the contact vias 102 are actually arranged below the inter-pixel electrodes 54 (closer to the wiring layer 101), but they are arranged over the inter-pixel electrodes 54 in FIG. 10 for easy understanding of the positions.

In FIG. 10, the wiring layers 101 are arranged in a stripe shape only in the column direction of the inter-pixel electrodes 54 in a grid shape, and the contact vias 102 are formed at the cross parts of the inter-pixel electrodes 54 in a grid shape.

In this way, the inter-pixel electrodes 54 can be supplied with voltage V3 not from the wiring layers around the pixel array part 3 but from the wiring layers 101 in the pixels. When the inter-pixel electrode 54 is made of a high-resistance film of the same type as the lower electrodes 51 such as indium tin oxide (ITO) film, it is lined by the wiring layer 101 in the pixel thereby to lower the resistance value.

Additionally, in the example of FIG. 10, the wiring layers 101 are formed in a stripe shape in the column direction, but may be formed in a stripe shape only in the row direction. Further, they may be in a grid shape as the inter-pixel electrodes 54. Further, the arrangement of the contact vias 102 or the connection points between the wiring layers 101 and the inter-pixel electrodes 54 are not limited to the cross parts of the inter-pixel electrodes 54 and may be at other positions.

<5. Fourth Embodiment of Pixels>
<Cross-Section Configuration Diagram of Pixels>

Figure 11:
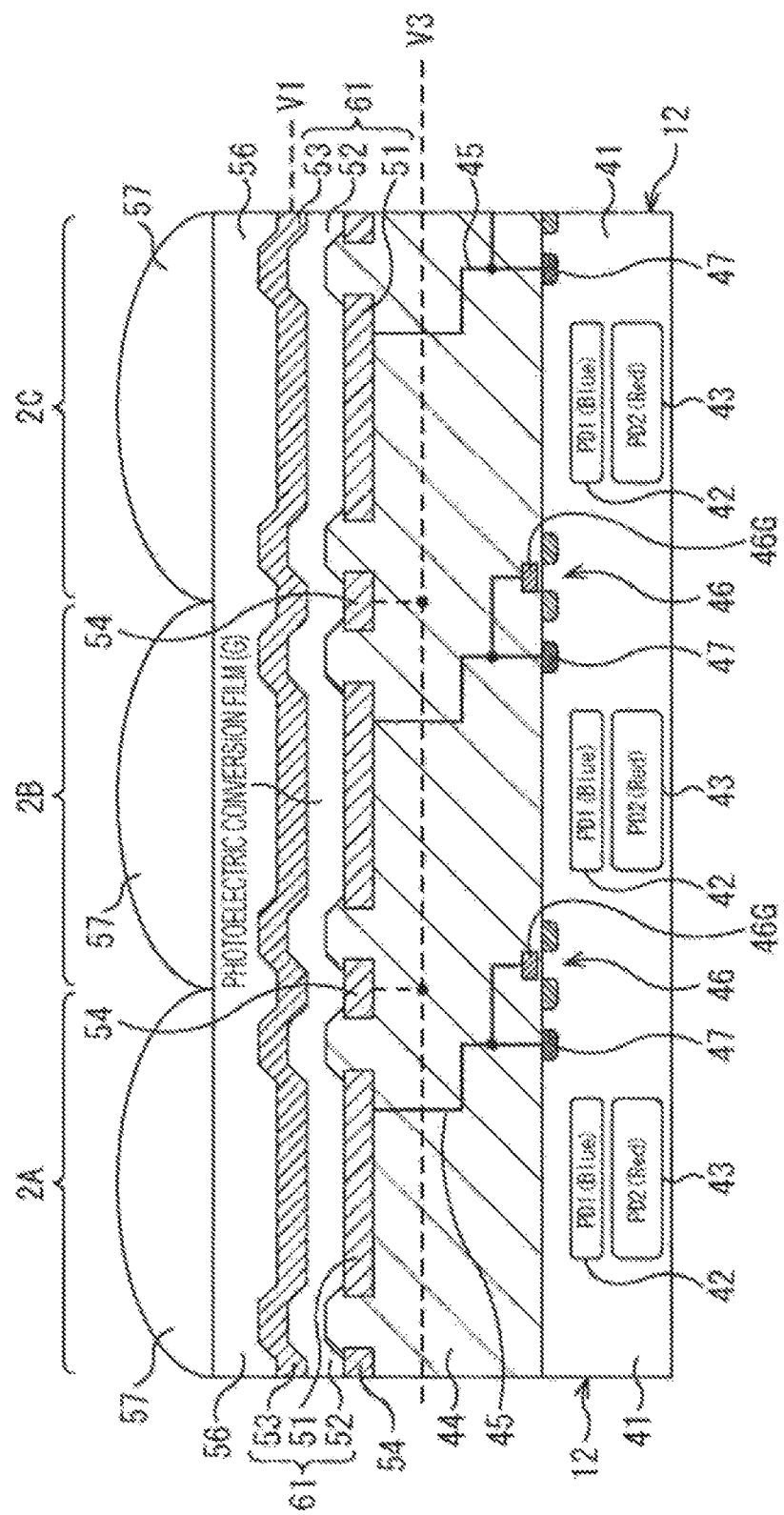
FIG. 11 is a cross-section configuration diagram of pixels according to a fourth embodiment.

FIG. 11 is a diagram illustrating a cross-section configuration of the pixels 2 according to a fourth embodiment.

When the structure of the fourth embodiment is compared with that of the first embodiment illustrated in FIG. 2, the fourth embodiment is different from the first embodiment in the shape of the uppermost surface of the multilayered wiring layer 44.

That is, the position of the uppermost surface of the multilayered wiring layer 44 is flattened according to the position of the uppermost surfaces of the lower electrodes 51 and the inter-pixel electrodes 54 according to the first embodiment illustrated in FIG. 2, while the positions of the multilayered wiring layers 44 between the lower electrode 51 and the inter-pixel electrode 54 are formed to be higher than the position of the uppermost surfaces of the lower electrodes 51 and the inter-pixel electrodes 54, in the fourth embodiment.

With the structure according to the first embodiment illustrated in FIG. 2, the insulative film of the multilayered wiring layer 44 formed on top of the lower electrodes 51 and the inter-pixel electrodes 54 is flattened as described below with reference to FIGS. 17A, 17B and 17C. On the other hand, with the structure of the fourth embodiment, the process of flattening the insulative film of the multilayered wiring layer 44 can be omitted, thereby reducing the number of steps.

<6. Fifth Embodiment of Pixels>
<Cross-Section Configuration Diagram of Pixels>

Figure 12:
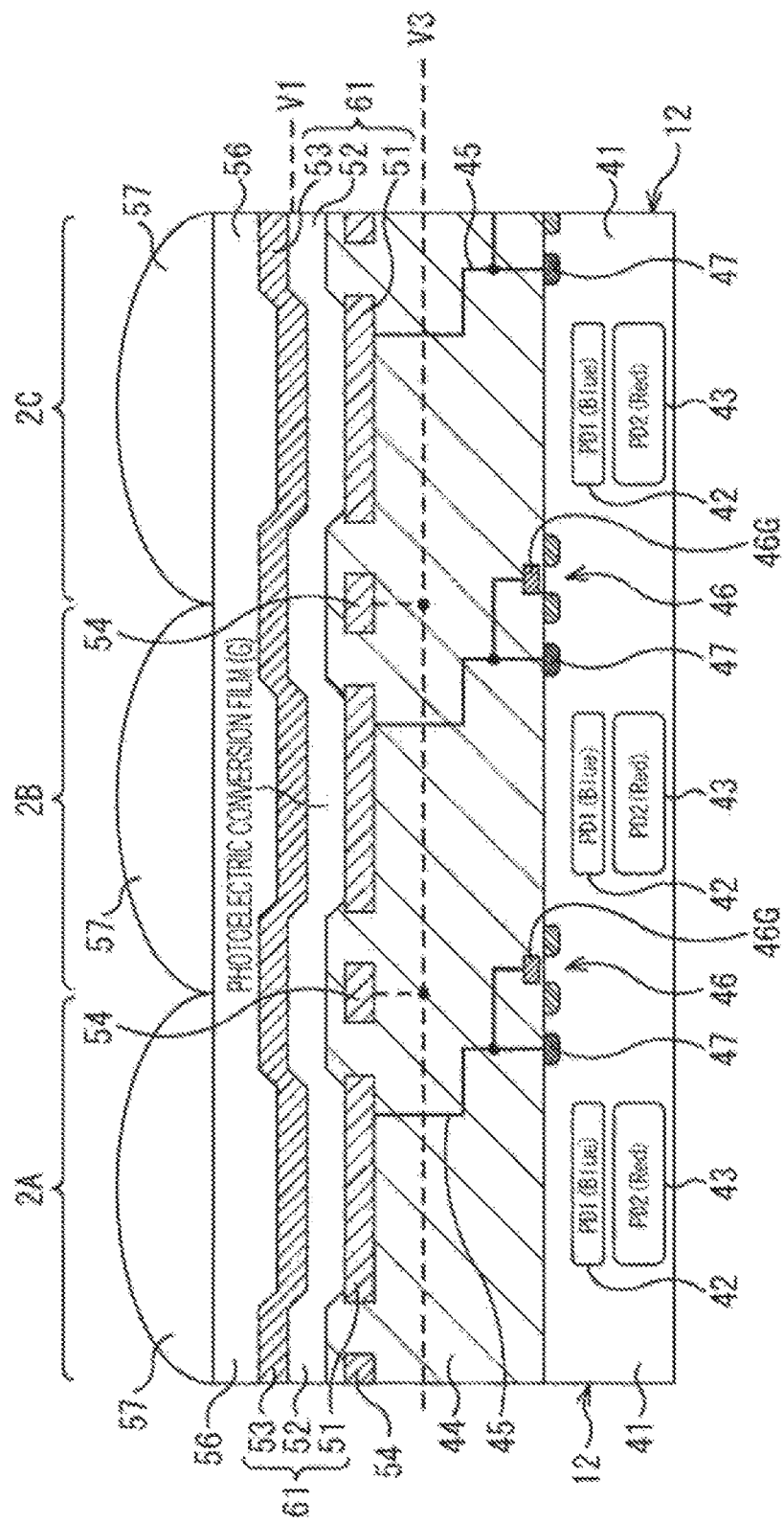
FIG. 12 is a cross-section configuration diagram of pixels according to a fifth embodiment.

FIG. 12 is a diagram illustrating a cross-section configuration of the pixels 2 according to a fifth embodiment.

When the structure of the fifth embodiment is compared with that of the first embodiment illustrated in FIG. 2, the fifth embodiment is different from the first embodiment in the shape of the uppermost surface of the multilayered wiring layer 44.

That is, the position of the uppermost surface of the multilayered wiring layer 44 is flattened according to the position of the uppermost surfaces of the lower electrodes 51 and the inter-pixel electrodes 54 according to the first embodiment illustrated in FIG. 2, while the positions of the multilayered wiring layer 44 between adjacent lower electrodes 51 are formed to be higher than the position of the uppermost surfaces of the lower electrodes 51 and the inter-pixel electrodes 54 according to the fifth embodiment.

Further, when the structure of the fifth embodiment is compared with that of the fourth embodiment illustrated in FIG. 11, the inter-pixel electrodes 54 contact the photoelectric conversion film 52 according to the fourth embodiment, while the insulative film of the multilayered wiring layer 44 is inserted between the inter-pixel electrodes 54 and the photoelectric conversion film 52 according to the fifth embodiment. The insulative film of the multilayered wiring layer 44 does not have the photoelectric conversion function. The thickness of the insulative film of the multilayered wiring layer 44 between the inter-pixel electrodes 54 and the photoelectric conversion film 52 is set such that tunnel current flows at lower voltage than voltage V3 applied to the inter-pixel electrodes 54.

<7. Sixth Embodiment of Pixels>
<Cross-Section Configuration Diagram of Pixels>

Figure 13:
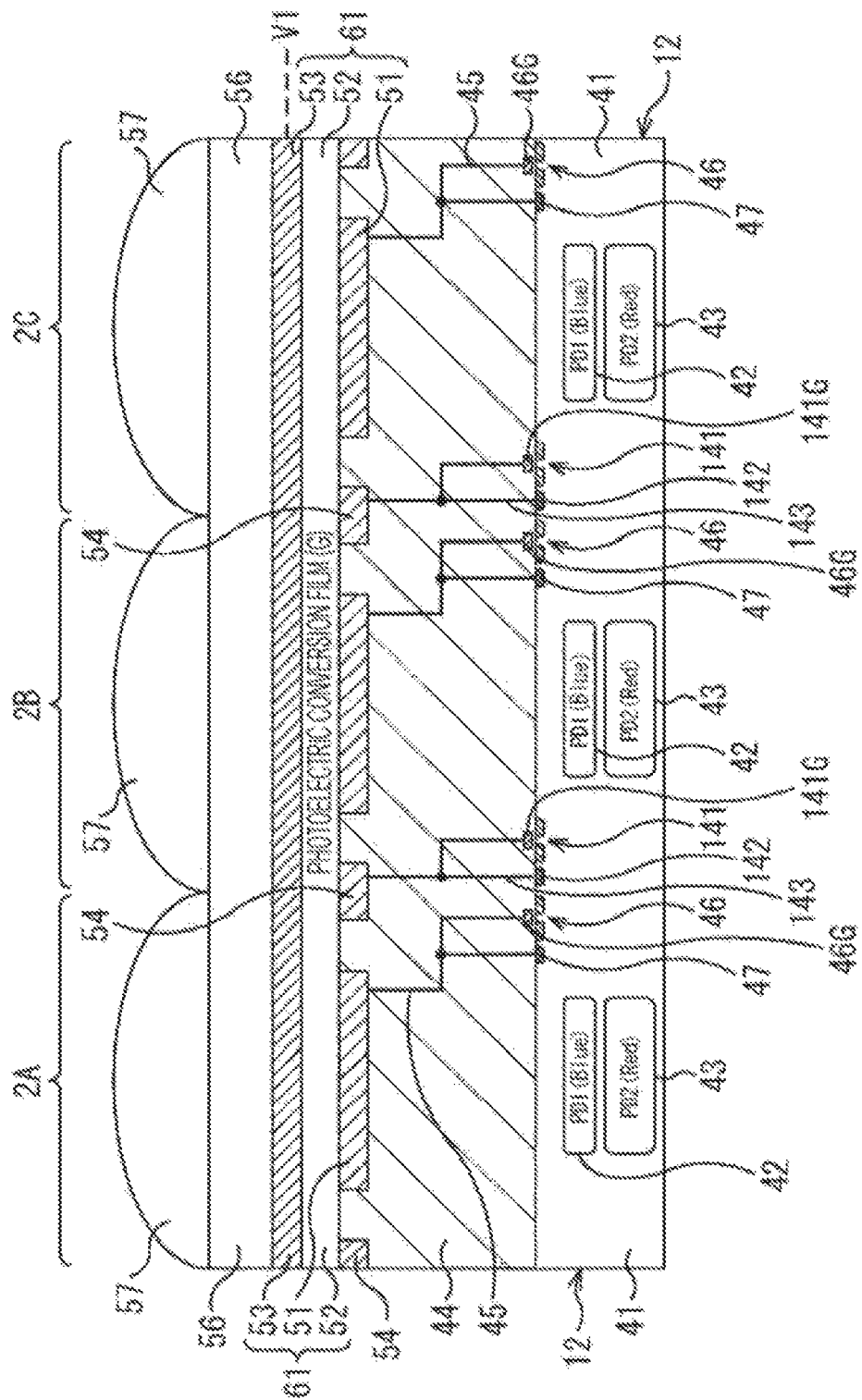
FIG. 13 is a cross-section configuration diagram of pixels according to a sixth embodiment.

FIG. 13 is a diagram illustrating a cross-section configuration of the pixels 2 according to a sixth embodiment.

When the structure of the sixth embodiment is compared with that of the first embodiment illustrated in FIG. 2, the sixth embodiment is different from the first embodiment in the connection destinations of the inter-pixel electrodes 54.

That is, according to the first embodiment illustrated in FIG. 2, the inter-pixel electrodes 54 are connected to the wiring layers around the pixel array part 3 and the inter-pixel electrodes 54 are supplied with the predetermined voltage V3.

On the other hand, according to the sixth embodiment, the inter-pixel electrode 54 is connected to a gate electrode 141G of an output transistor 141 and a FD unit 142 dedicated thereto via a metal wiring 143 formed in the multilayered wiring layer 44. Further, though not illustrated, a reset transistor for resetting the charges captured in the inter-pixel electrode 54 and a selective transistor are provided similarly to the photoelectric conversion unit 61.

Figure 14:
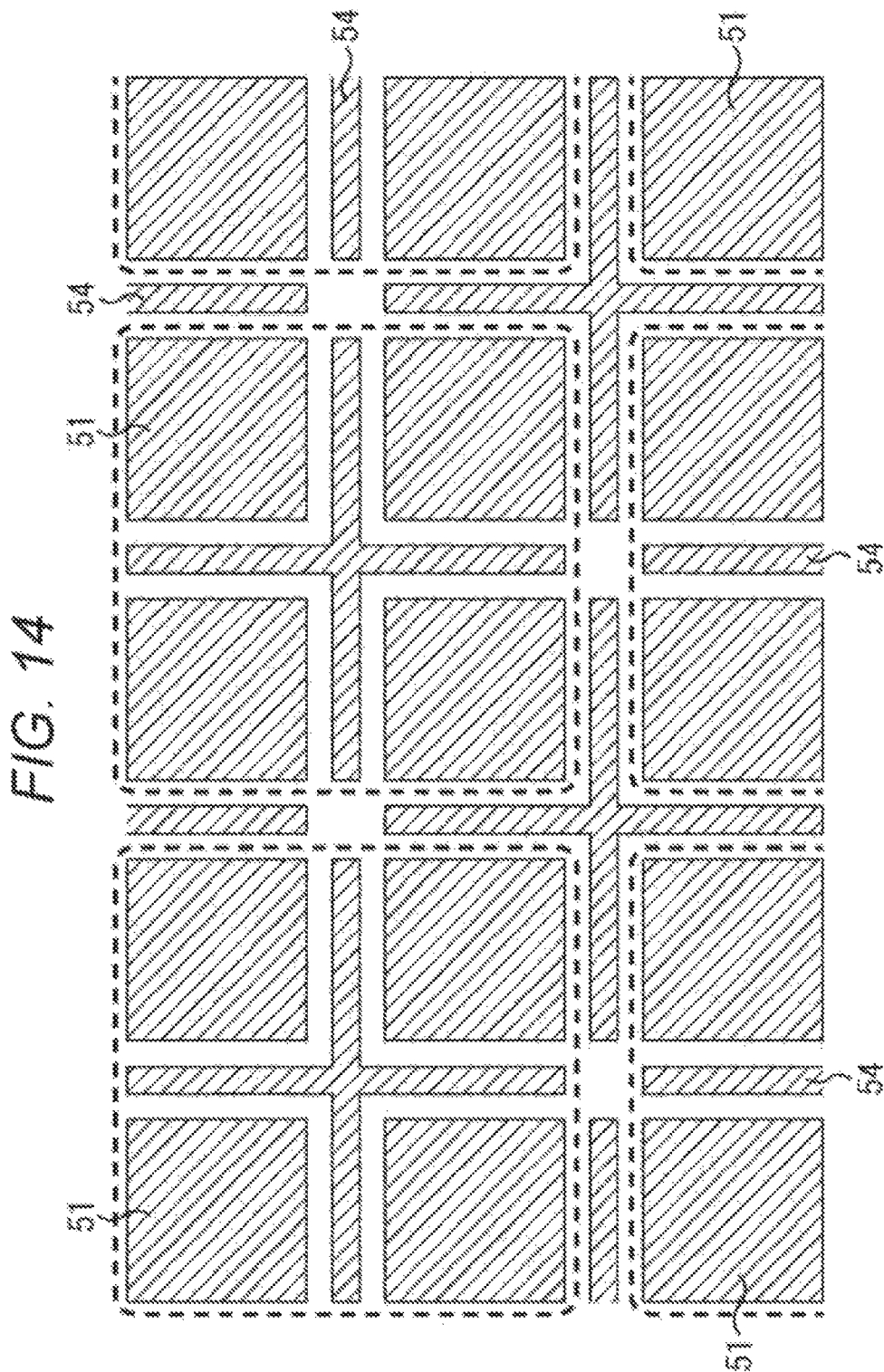
FIG. 14 is a diagram illustrating a plane layout of lower electrodes and inter-pixel electrodes.

FIG. 14 is a diagram illustrating a plane layout of the lower electrodes 51 and the inter-pixel electrodes 54 according to the sixth embodiment.

The arrangement of the inter-pixel electrodes 54 according to the sixth embodiment is in the plane layout illustrated in FIG. 7. That is, some cross parts of the inter-pixel electrodes 54 in a grid shape are omitted, and thus the pattern-separated inter-pixel electrodes 54 are arranged in a cross shape between the lower electrodes 51 of four pixels of 2×2.

When the solid state image sensor 1 includes a pixel addition mode of adding and outputting a pixel signal for four pixels of 2×2 as operation mode, the solid state image sensor 1 outputs a signal of charges captured by the inter-pixel electrodes 54 within a broken line as part of the pixel signal to the output transistor 141 assuming four pixels surrounded in a broken line in FIG. 7 as output unit. Thereby, a pixel signal in the four pixels within in a broken line as output unit is obtained by adding a signal of charges captured in the lower electrodes 51 of the pixels and a signal of charges captured in the inter-pixel electrodes 54 within the broken line, and a light received within the four-pixel region can be photoelectrically converted without any loss to be output as a pixel signal. The reset transistor is turned on thereby to cause the inter-pixel electrodes 54 not included in the output units surrounded in a broken line to discharge the charges, and thus the shield function works similarly as in the above embodiments.

Further, when the reset transistor is turned on thereby to discharge the charges captured in all the inter-pixel electrodes 54, the shield function works similarly as in the first to fifth embodiments described above.

<8. Seventh Embodiment of Pixels>
<Cross-Section Configuration Diagram of Pixels>

Figure 15:
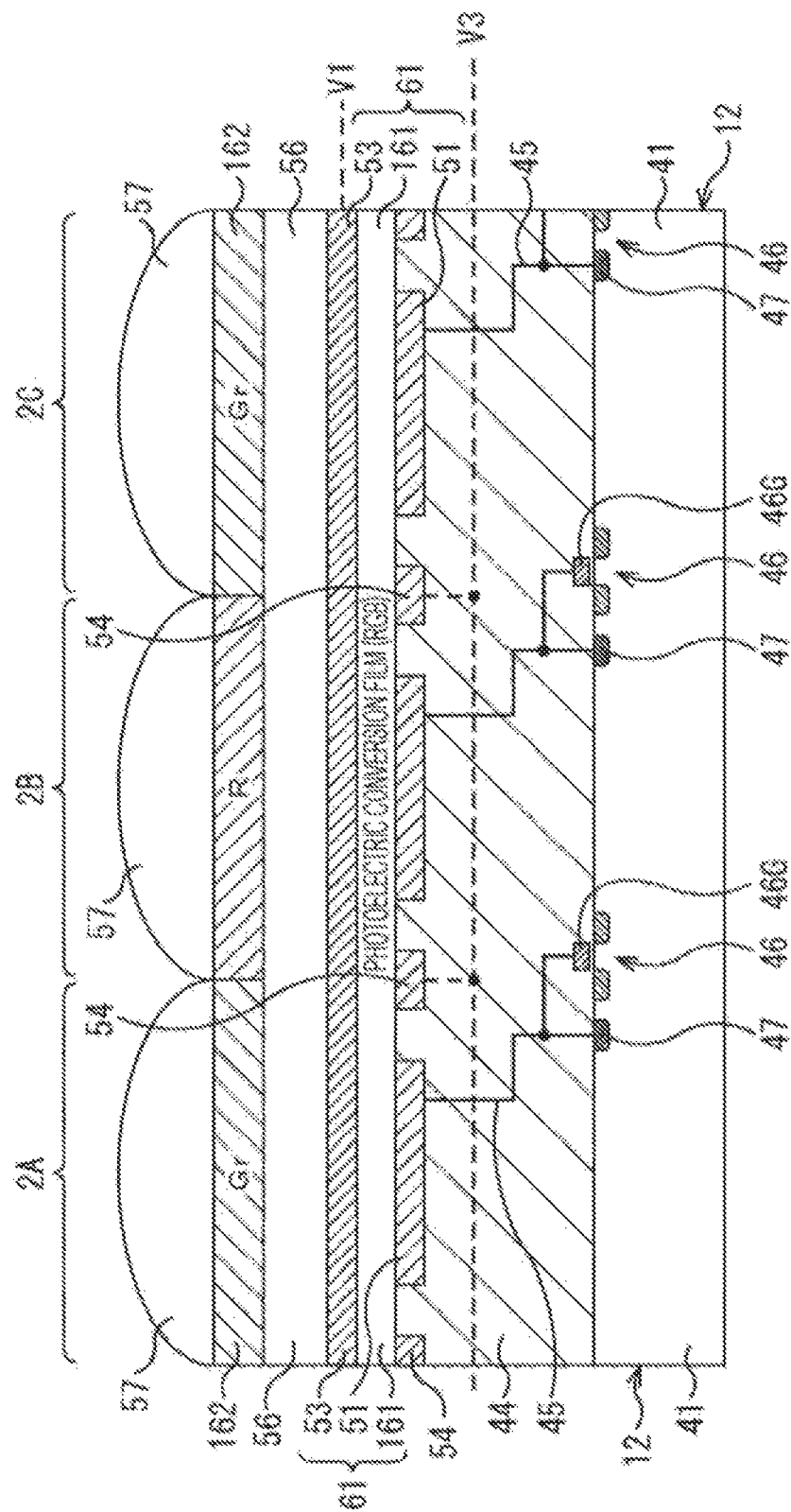
FIG. 15 is a cross-section configuration diagram of pixels according to a seventh embodiment.

FIG. 15 is a diagram illustrating a cross-section configuration of the pixels 2 according to a seventh embodiment.

A difference lies in that each pixel 2 receives lights of all the wavelengths of red (R), green (G), and blue (B) by the photoelectric conversion unit 61 and the photodiodes PD1 and PD2 according to the first to sixth embodiments described above while each pixel 2 receives only lights of any wavelength of red (R), green (G), or blue (B) according to the seventh embodiment.

When the structure of the seventh embodiment in FIG. 15 is compared with that of the first embodiment illustrated in FIG. 2, the seventh embodiment is different from the first embodiment in that the photoelectric conversion film 52 for photoelectrically converting a green wavelength light in FIG. 2 is replaced with a photoelectric conversion film 161 for photoelectrically converting lights of all the wavelengths of red (R), green (G), and blue (B) in FIG. 15. Further, the photodiodes PD1 for receiving a blue light and the photodiodes PD2 for receiving a red light are not provided in the semiconductor substrate 12.

Further, in FIG. 15, color filters 162 for transmitting a light of a wavelength of red (R), green (G), or blue (B) are newly provided between the high refractive index layer 56 and the on-chip lenses 57. Each of red (R), green (G), and blue (B) of the color filters 162 is arranged in the Bayer layout, for example.

Therefore, only a light of any wavelength of red (R), green (G), or blue (B) passing through a color filter 162 reaches the photoelectric conversion film 161, and thus each pixel 2 receives only a light of any wavelength of red (R), green (G), or blue (B).

The above effects by provision of the inter-pixel electrodes 54 described according to the first embodiment can be obtained in the second to seventh embodiments described above.

<9. Manufacture Method According to First Embodiment>

A method for manufacturing the pixels 2 according to the first embodiment illustrated in FIG. 2 will be described below with reference to FIGS. 16A, 16B and 16C to FIGS. 18A and 18B.

Figure 16A:
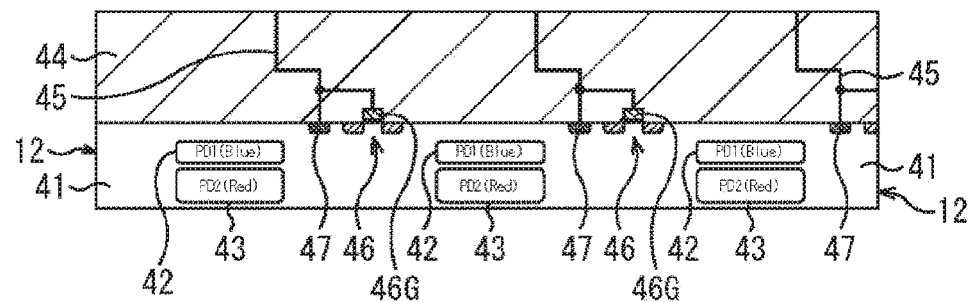
FIGS. 16A, 16B and 16C a are diagrams for explaining a manufacture method according to the first embodiment.

At first, as illustrated in FIG. 16A, the photodiodes PD1 and PD2 are formed in the semiconductor region 41 of the semiconductor substrate 12, and the multilayered wiring layer 44 formed of a plurality of wiring layers and interlayer insulative films is formed on the surface (the upper side in the Figure) of the semiconductor substrate 12. The output transistors 46, the FD parts 47, a plurality of pixel transistors for reading the charges accumulated in the photodiodes PD1 and PD2, and the like are formed on the surface interface of the semiconductor substrate 12.

Figure 16B:
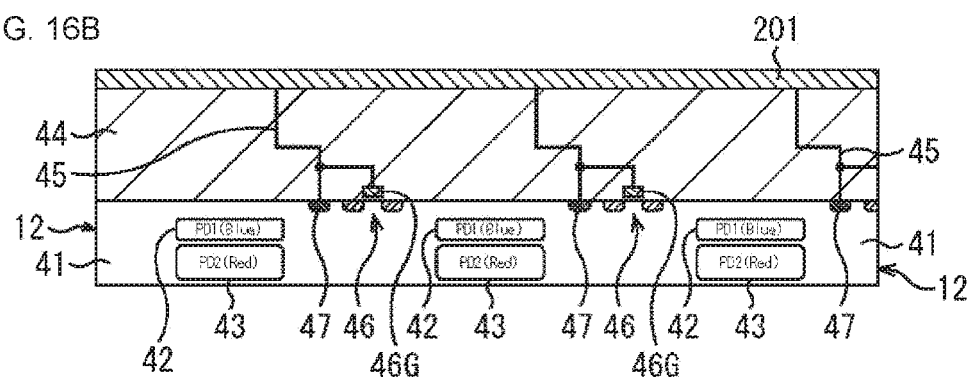

Then, as illustrated in FIG. 16B, an indium tin oxide (ITO) film 201 is formed on top of the multilayered wiring layer 44 at a predetermined thickness, for example.

Figure 16C:
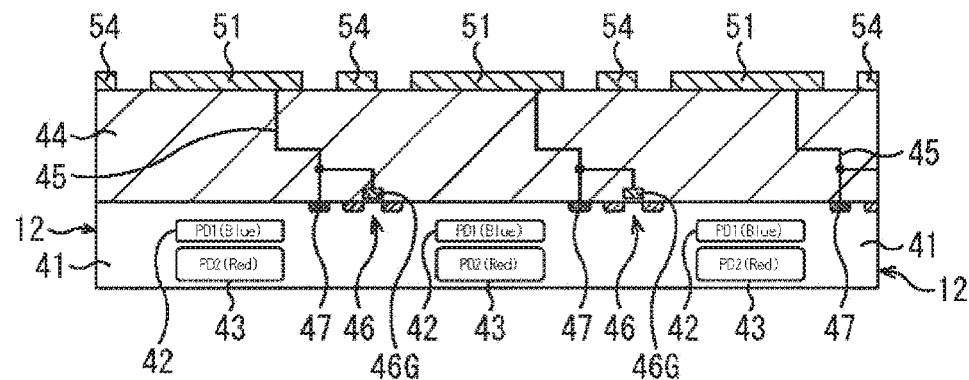

Then, as illustrated in FIG. 16C, predetermined regions in the ITO film 201 formed on the entire surface of the multilayered wiring layer 44 are patterned by lithography thereby to form the lower electrodes 51 and the inter-pixel electrodes 54.

Figure 17A:
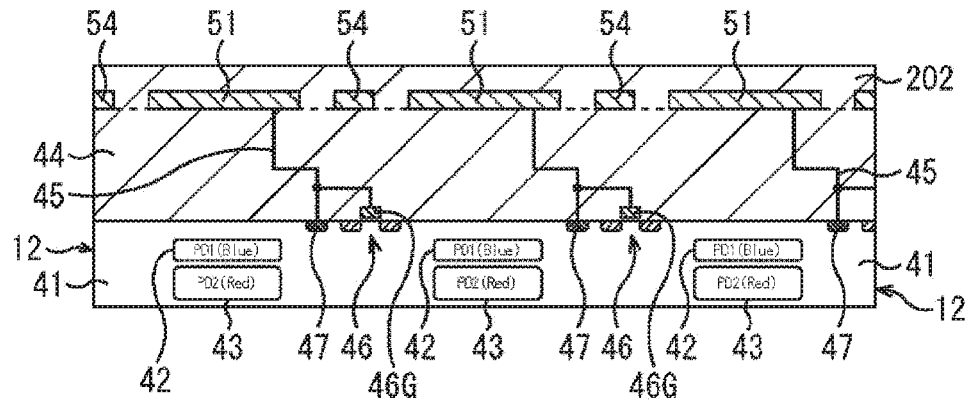
FIGS. 17A, 17B and 17C a are diagrams for explaining the manufacture method according to the first embodiment.
Figure 17B:
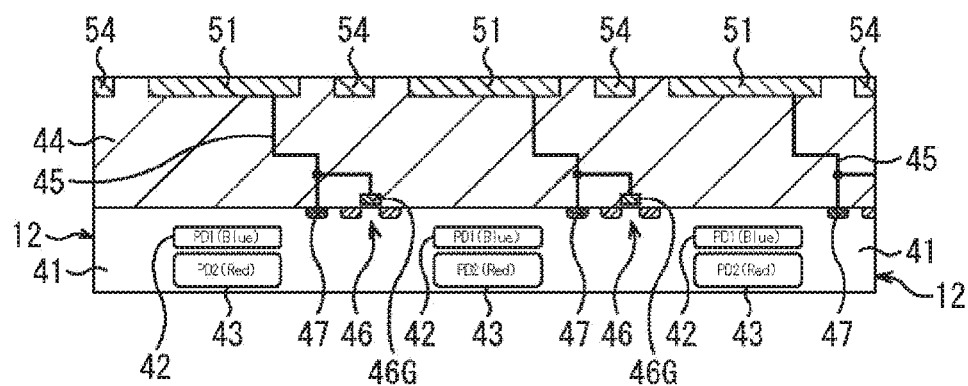
Figure 17C:
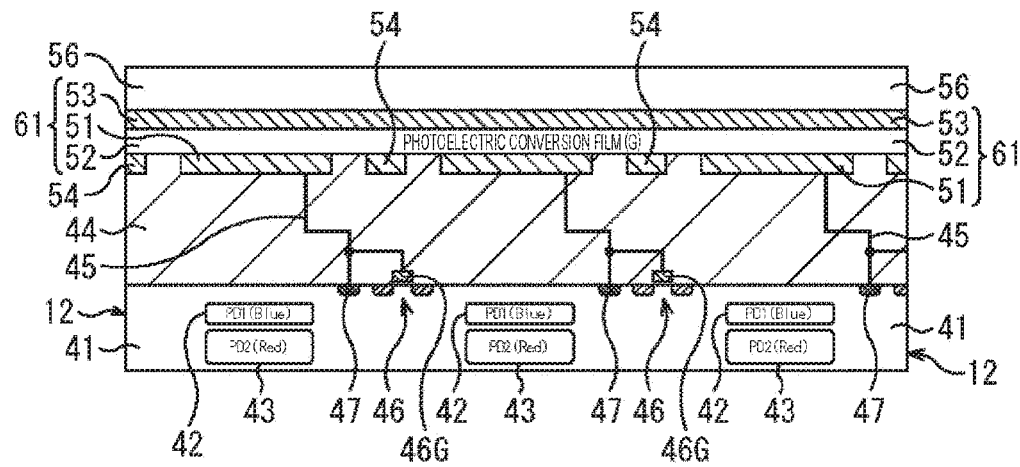

Then, as illustrated in FIG. 17A, a transparent insulative film 202 is laminated on the lower electrodes 51 and the inter-pixel electrodes 54. Thereafter, as illustrated in FIG. 17B, the transparent insulative film 202 is removed by chemical mechanical polishing (CMP), for example, and flattened until it has the same film thickness as the lower electrodes 51 and the inter-pixel electrodes 54.

Subsequently, as illustrated in C of FIG. 17C, the photoelectric conversion film 52, the upper electrode 53, and the high refractive index layer 56 are sequentially formed.

Figure 18A:
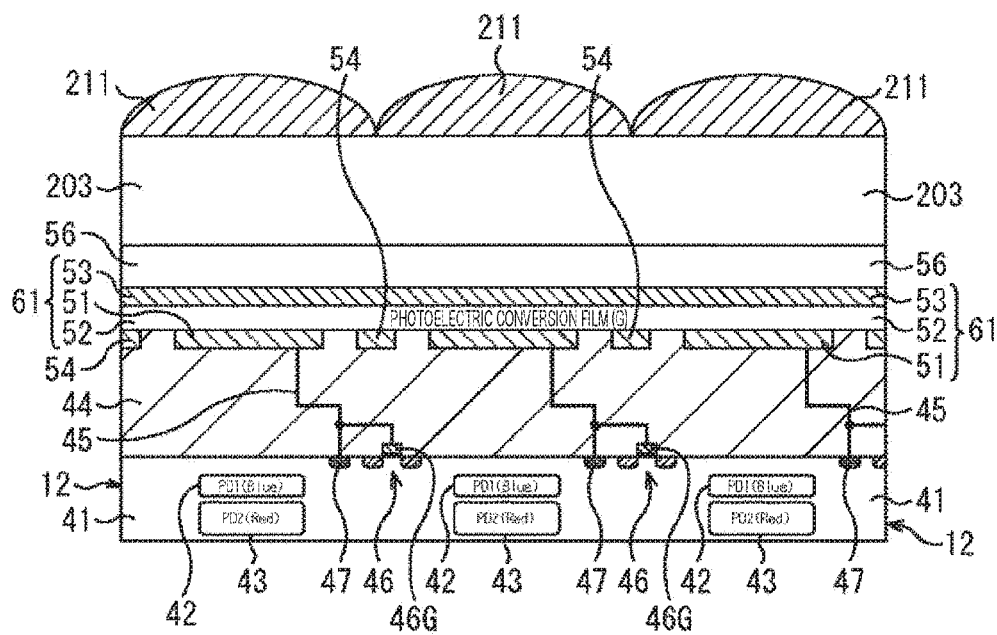
FIGS. 18A and 18B are diagrams for explaining the manufacture method according to the first embodiment.
Figure 18B:
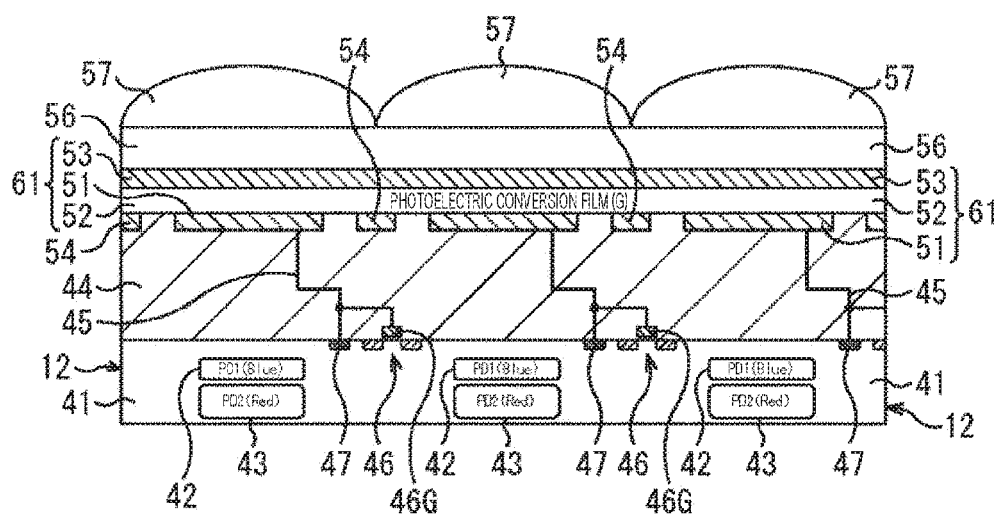

Then, as illustrated in FIG. 18A, a resin-based material 203 as a material of the on-chip lenses 57 is further formed on the high refractive index layer 56, and then photoresist 211 is formed in lens shapes. Then, the resin-based material 203 is etched back on the basis of the lens-shaped photoresist 211 so that the on-chip lenses 57 are formed on the uppermost part of the pixels 2 as illustrated in FIG. 18B.

The pixels 2 according to the first embodiment illustrated in FIG. 2 can be manufactured as described above.

<10. Eighth Embodiment of Pixels>
<Cross-Section Configuration Diagram of Pixels>

FIG. 19 is a diagram illustrating a cross-section configuration of the pixels 2 according to an eighth embodiment.

The first to seventh embodiments employ a CMOS solid state image sensor of surface irradiation type in which the surface of the semiconductor substrate 12 on which the multilayered wiring layer 44 is formed is assumed as a light receiving surface, but the CMOS solid state image sensor may be of backside irradiation type.

FIG. 19 illustrates a cross-section configuration of the pixels 2 when the solid state image sensor 1 is of backside irradiation type.

Specifically, the multilayered wiring layer 44 is formed on the surface of the semiconductor substrate 12 on the lower side of the semiconductor substrate 12 in FIG. 19, and the photoelectric conversion unit 61, the inter-pixel electrodes 54, the high refractive index layer 56, and the on-chip lenses 57 are formed on the backside of the semiconductor substrate 12 opposite to the bottom via a transparent insulative film 231. The transparent insulative film 231 is made of a two- or three-layer film of hafnium oxide (HfO2) film and silicon oxide film, for example.

The FD units 47, and the pixel transistors including the output transistors 46 are formed on the surface of the multilayered wiring layer 44. A FD unit 47 and a gate electrode 46G of an output transistor 46 are connected to a lower electrode 51 in the photoelectric conversion unit 61 via a metal wiring 241 formed in the multilayered wiring layer 44, a conductive plug 242 formed through the semiconductor region 41 of the semiconductor substrate 12, and a metal wiring 243 penetrating through the transparent insulative film 231. The metal wiring 241 is made of a metal material such as tungsten (W), aluminum (Al), or copper (Cu). Further, the outer periphery of the conductive plug 242 is insulated by an insulative film such as SiO2 or SiN.

An inter-pixel electrode 54 is provided between lower electrodes 51, and thus the effects described according to the first embodiment can be obtained also with the backside irradiation type pixel structure.

Additionally, FIG. 19 illustrates a structure in which the pixel structure according to the first embodiment illustrated in FIG. 2 is applied to backside irradiation type, but the pixel structures according to the second to seventh embodiments may be applied to backside irradiation type.

<11. Ninth Embodiment of Pixels>
<Cross-Section Configuration Diagram of Pixels>

Figure 20:
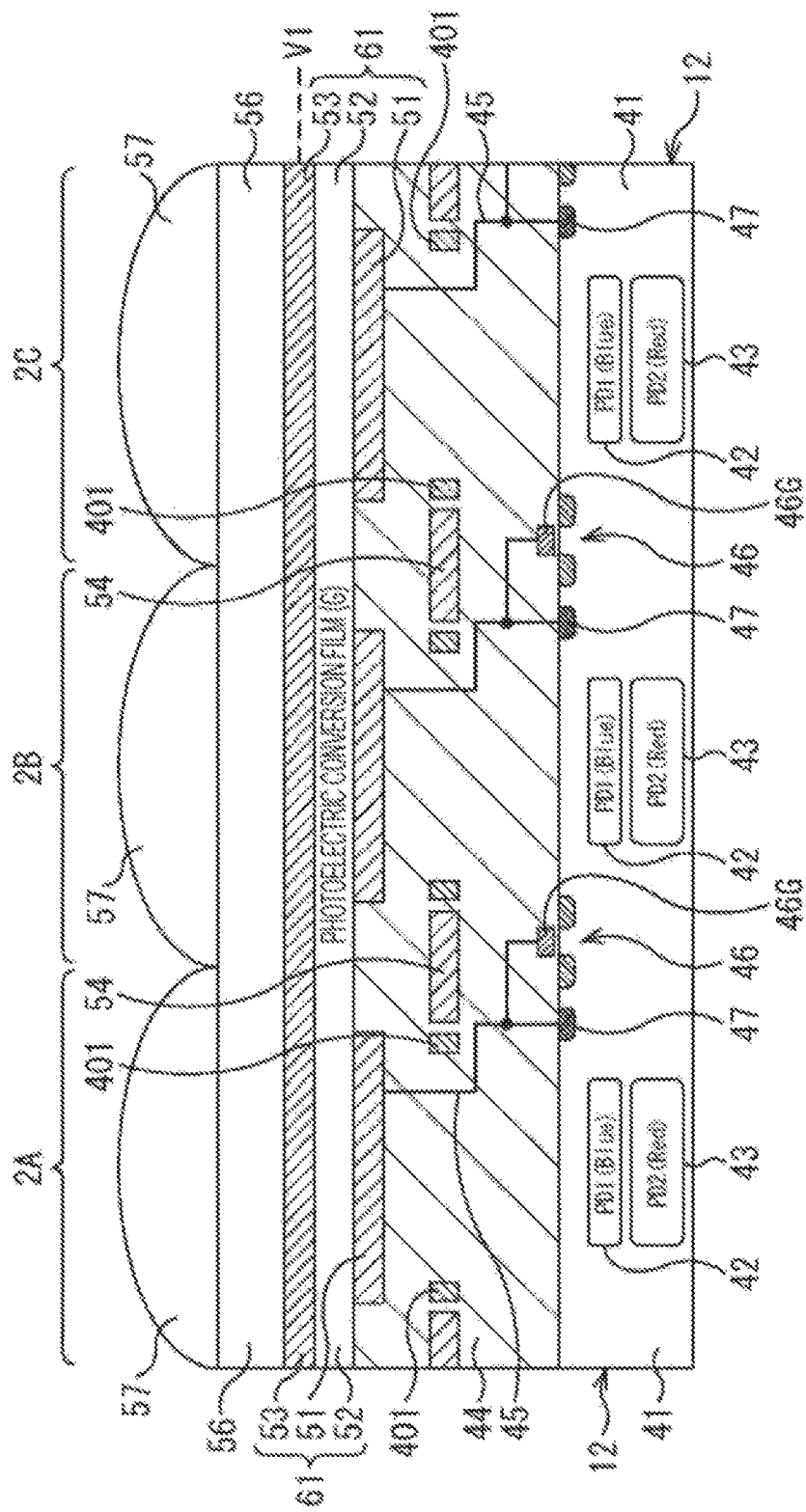
FIG. 20 is a cross-section configuration diagram of pixels according to a ninth embodiment.

FIG. 20 is a diagram illustrating a cross-section configuration of the pixels 2 according to a ninth embodiment.

According to the ninth embodiment, the inter-pixel electrodes 54 are formed not in the same layer as the lower electrodes 51 separated per pixel, but in a lower layer than the layer in which the lower electrodes 51 are formed. In other words, the ninth embodiment is different from the first to eighth embodiments in the position of the inter-pixel electrodes 54 in the depth direction.

The insulative film of the multilayered wiring layer 44 is arranged between adjacent lower electrodes 51 where an inter-pixel electrode 54 is arranged according to the first to eighth embodiments, and the insulative film and the top surfaces of the lower electrodes 51 are flattened to be the same plane.

On the other hand, the layer in which the inter-pixel electrodes 54 are formed is the same as a predetermined wiring layers 401 in the multilayered wiring layer 44 as illustrated in FIG. 20, for example. The inter-pixel electrodes 54 can be made of the same material as the lower electrodes 51, and can be made of a metal material such as tungsten (W), aluminum (Al), or copper (Cu). When the same metal material as the material of the wiring layers 401 is employed for a material of the inter-pixel electrodes 54, the inter-pixel electrodes 54 can be formed at the same time with the wiring layers 401 in the same manufacture method as the wiring layers 401, and have a light shielding property. Additionally, the inter-pixel electrodes 54 may be formed in a different layer from the wiring layers 401 in the multilayered wiring layer 44.

As illustrated in FIG. 20, the inter-pixel electrodes 54 are arranged in a layer different from the lower electrodes 51, and thus an inter-pixel distance can be shortened, thereby downsizing the pixels. Alternatively, when an inter-pixel distance is not shortened, the lower electrodes 51 can be formed in a larger plane size.

Figure 21:
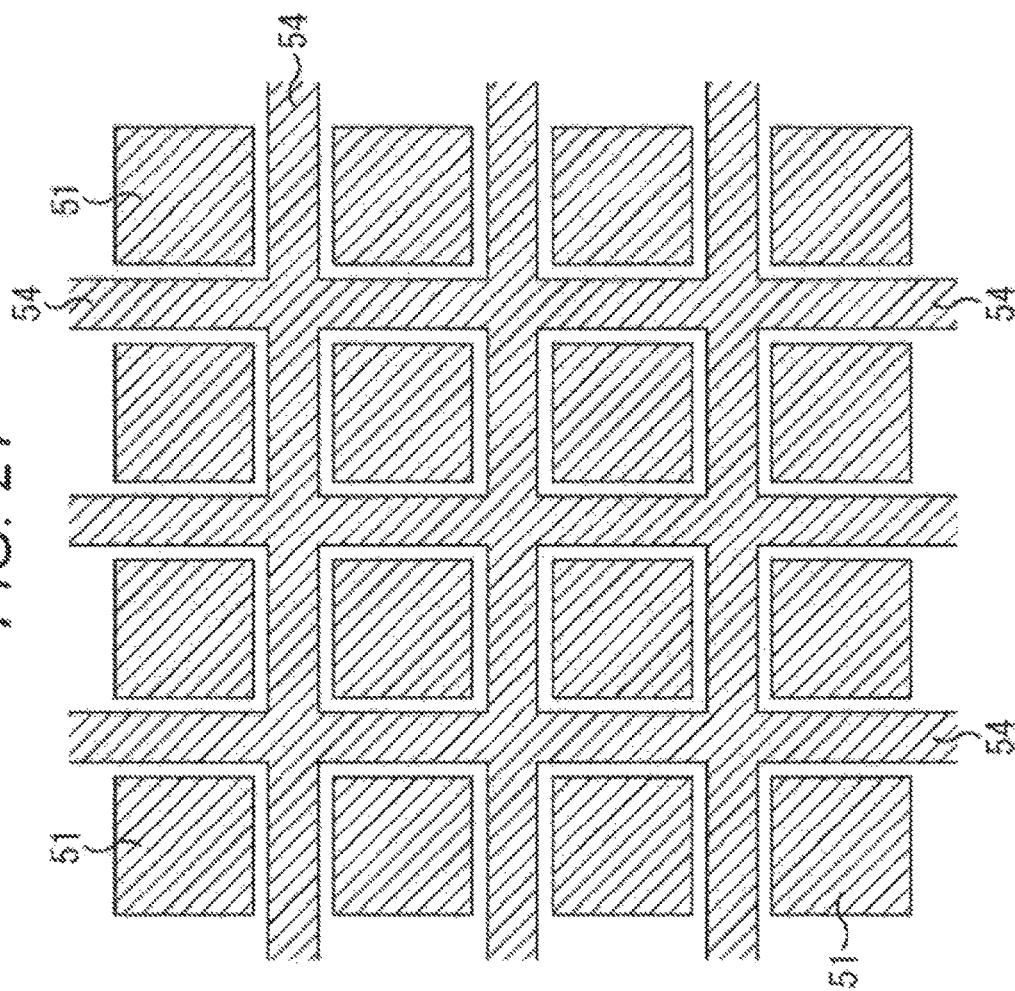
FIG. 21 is a diagram illustrating an exemplary layout of inter-pixel electrodes according to the ninth embodiment.

FIG. 21 is a diagram illustrating an exemplary plane layout of the inter-pixel electrodes 54 and the lower electrodes 51 when the inter-pixel electrodes 54 are arranged in a layer different from the lower electrodes 51.

An inter-pixel electrode 54 is basically on a border between pixels 2 as illustrated in FIG. 3, and can be formed between adjacent lower electrodes 51 at a predetermined pattern width in a grid shape.

The inter-pixel electrodes 54 are connected to the wiring layers (not illustrate) around the pixel array part 3 and the inter-pixel electrodes 54 are supplied with the predetermined voltage V3 via the wiring layers. Additionally, the predetermined voltage V3 to be supplied to the inter-pixel electrodes 54 may take a fixed (constant) voltage value or a temporally-varying voltage value.

Figure 22:
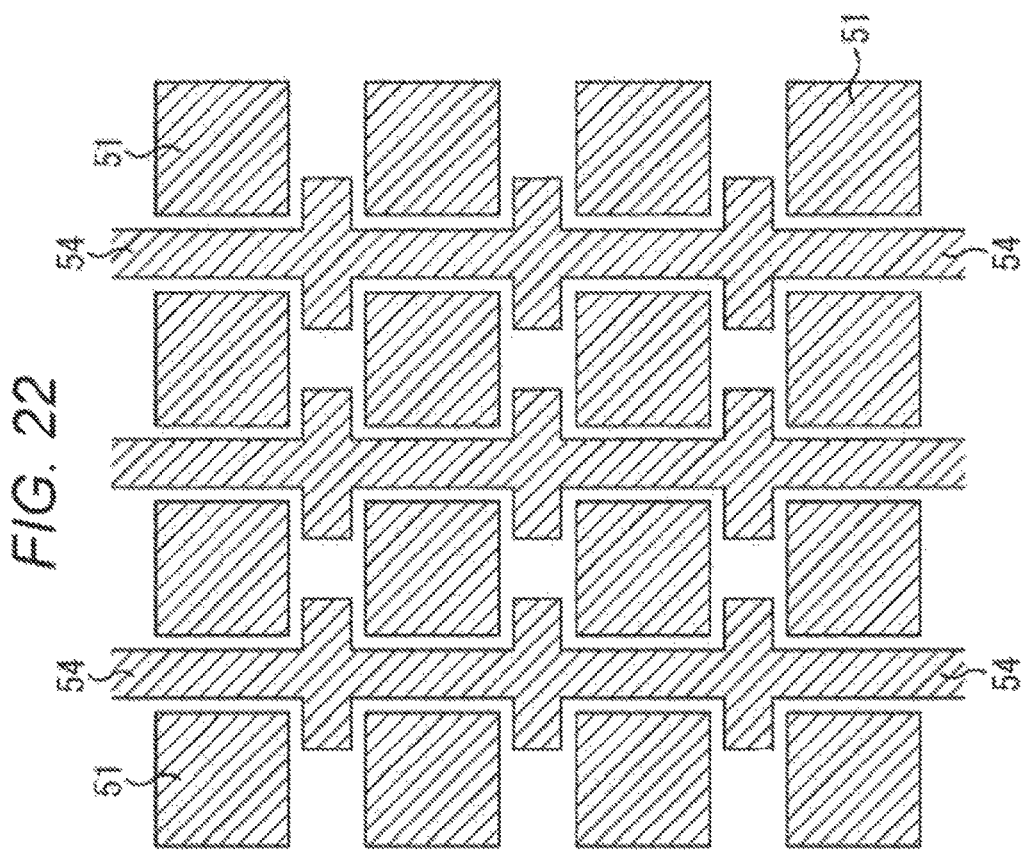
FIG. 22 is a diagram illustrating other exemplary layout of inter-pixel electrodes according to the ninth embodiment.
Figure 23:
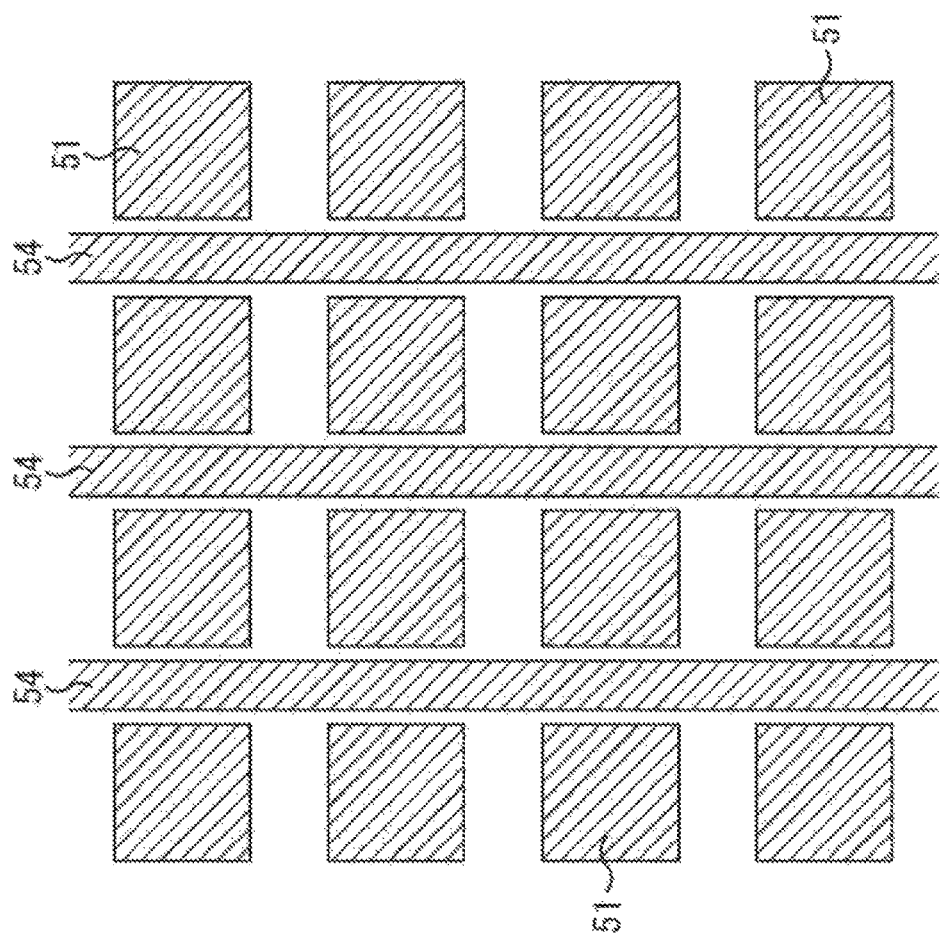
FIG. 23 is a diagram illustrating other exemplary layout of inter-pixel electrodes according to the ninth embodiment.

FIG. 22 and FIG. 23 are the diagrams illustrating other exemplary plane layouts of the inter-pixel electrodes 54 and the lower electrodes 51.

The inter-pixel electrodes 54 are formed in a line shape (stripe shape in FIG. 22) for the entire pixel array part 3 between adjacent pixels in the row direction (in the horizontal direction) as illustrated in FIG. 22, and only the cross parts of the inter-pixel electrodes 54 in a grid shape in FIG. 21 may be formed between adjacent pixels in the column direction (in the vertical direction).

Alternatively, as illustrated in FIG. 23, the inter-pixel electrodes 54 may be formed in a line shape (stripe shape) for the entire pixel array part 3 only between adjacent pixels in the row direction, and though not illustrated, may be formed in a line shape (stripe shape) for the entire pixel array part 3 only between adjacent pixels in the column direction.

<12. 10th Embodiment of Pixels>
<Cross-Section Configuration Diagram of Pixels>

Figure 24:
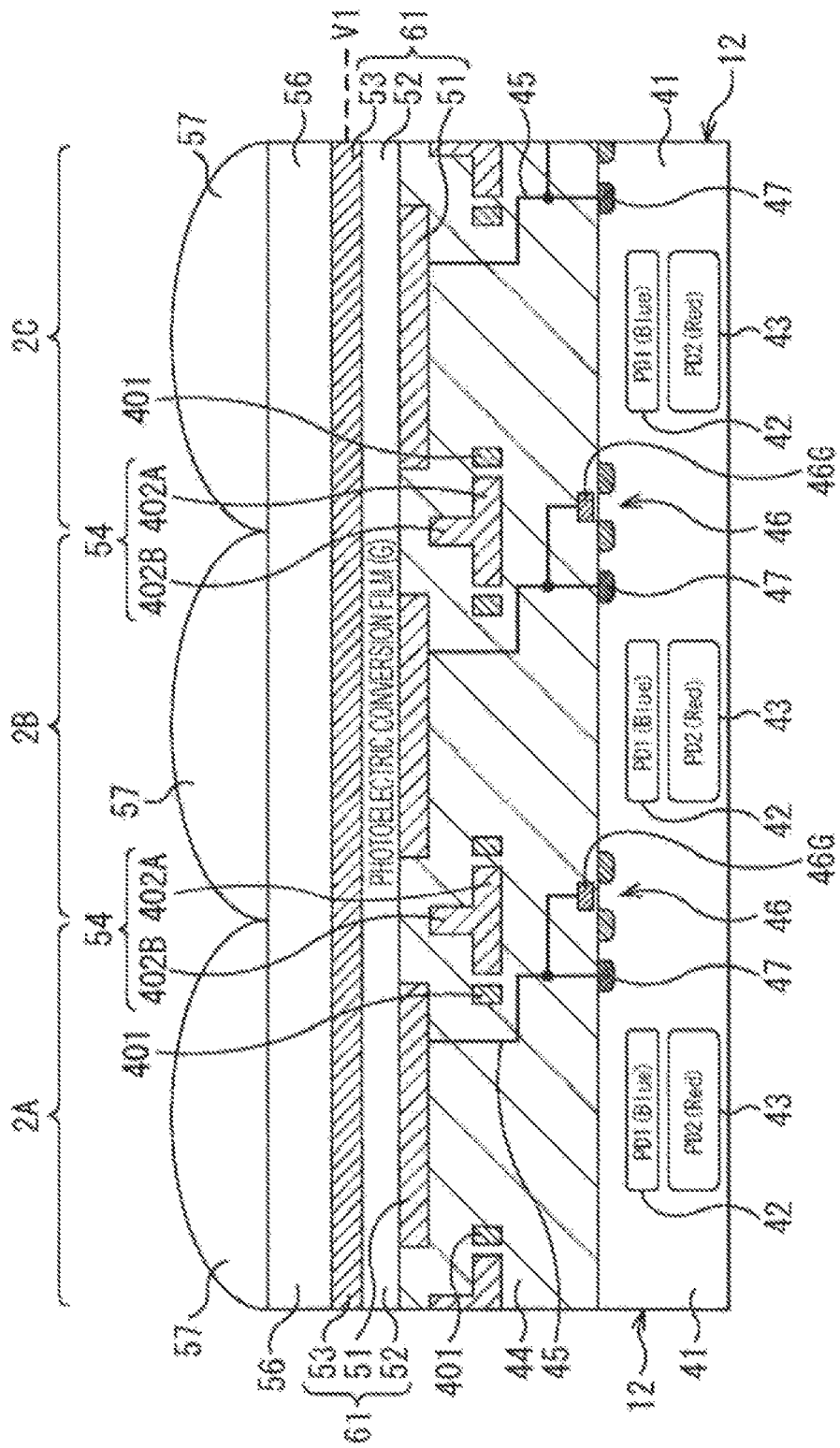
FIG. 24 is a cross-section configuration diagram of pixels according to a 10th embodiment.

FIG. 24 is a diagram illustrating a cross-section configuration of the pixels 2 according to a 10th embodiment.

An inter-pixel electrode 54 according to the 10th embodiment is configured of a plane electrode part 402A extended in the plane direction which corresponds to an inter-pixel electrode 54 according to the ninth embodiment illustrated in FIG. 20, and a protruded electrode part 402B protruded upward as high as the lower surfaces of the lower electrodes 51 at the center part of the plane electrode part 402A in a cross-section view. The cross-section shape of the inter-pixel electrode 54 is formed in an upside-down T shape formed of the plane electrode part 402A and the protruded electrode part 402B in this way, and thus the distance between the inter-pixel electrode 54 and the lower electrode 51 is shorter than in the ninth embodiment illustrated in FIG. 20, thereby further strengthening the shield operation due to voltage V3 to be applied to the inter-pixel electrode 54.

Figure 25:
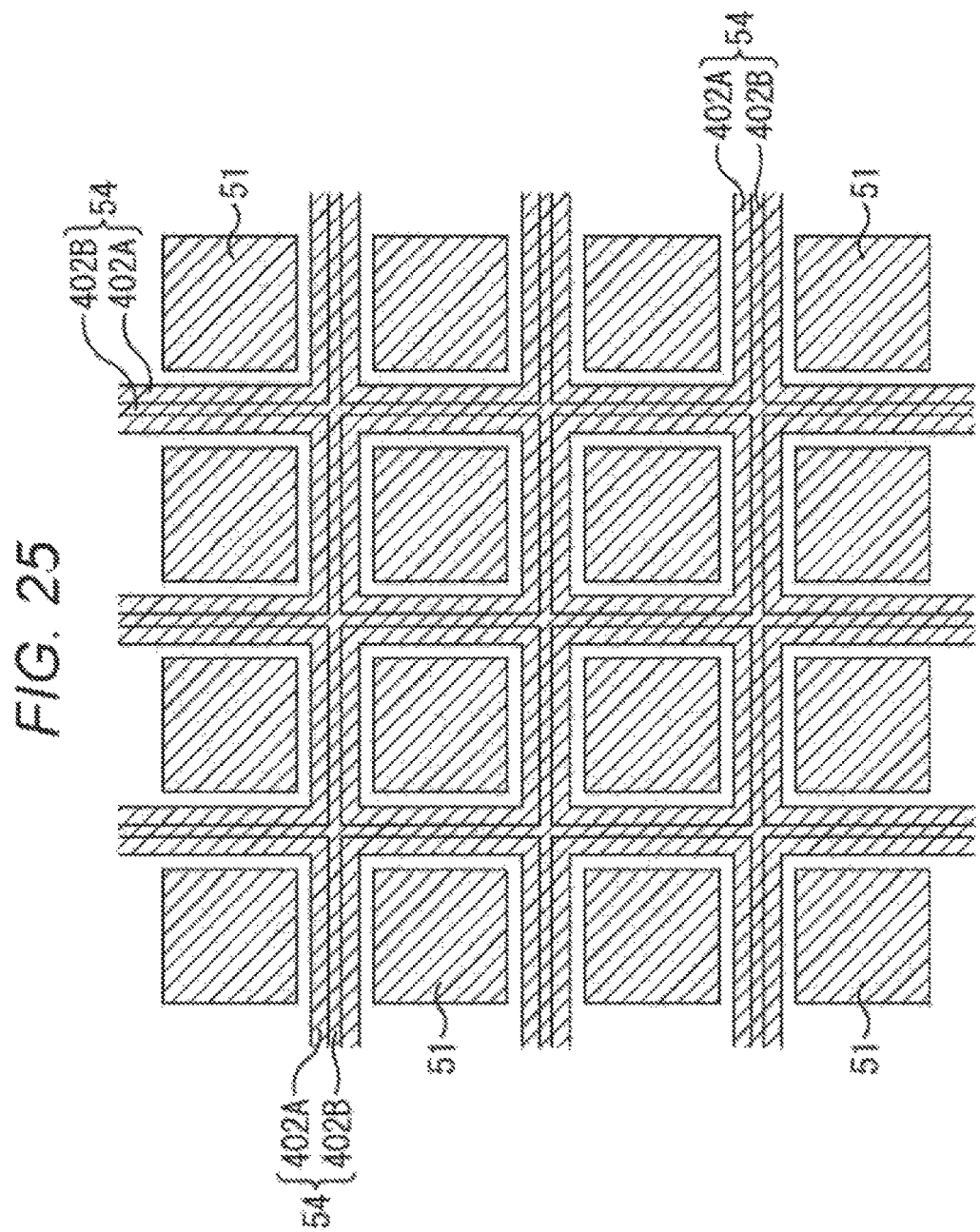
FIG. 25 is a diagram illustrating an exemplary layout of inter-pixel electrodes according to the 10th embodiment.
Figure 26:
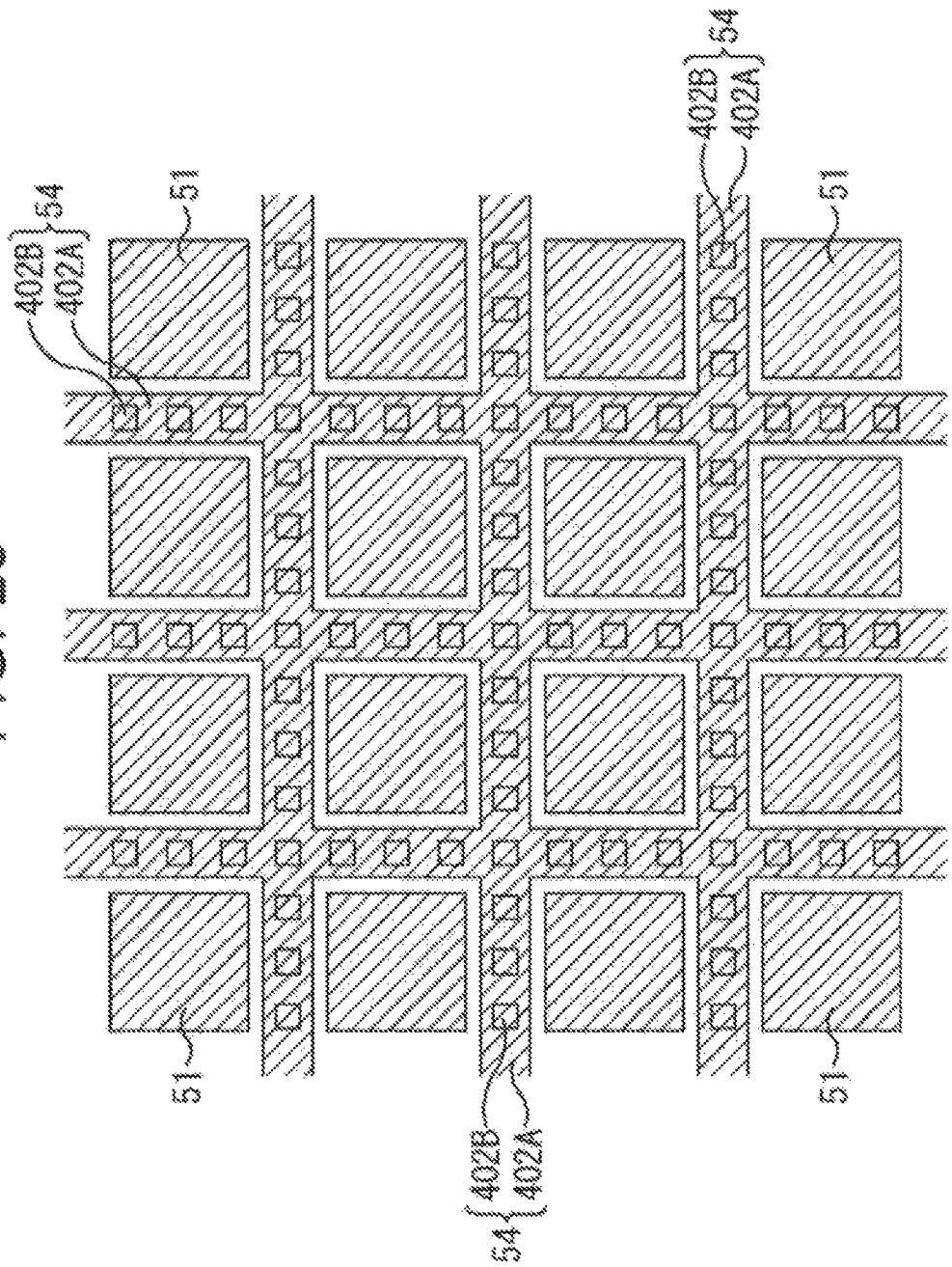
FIG. 26 is a diagram illustrating other exemplary layout of inter-pixel electrodes according to the 10th embodiment.
Figure 27:
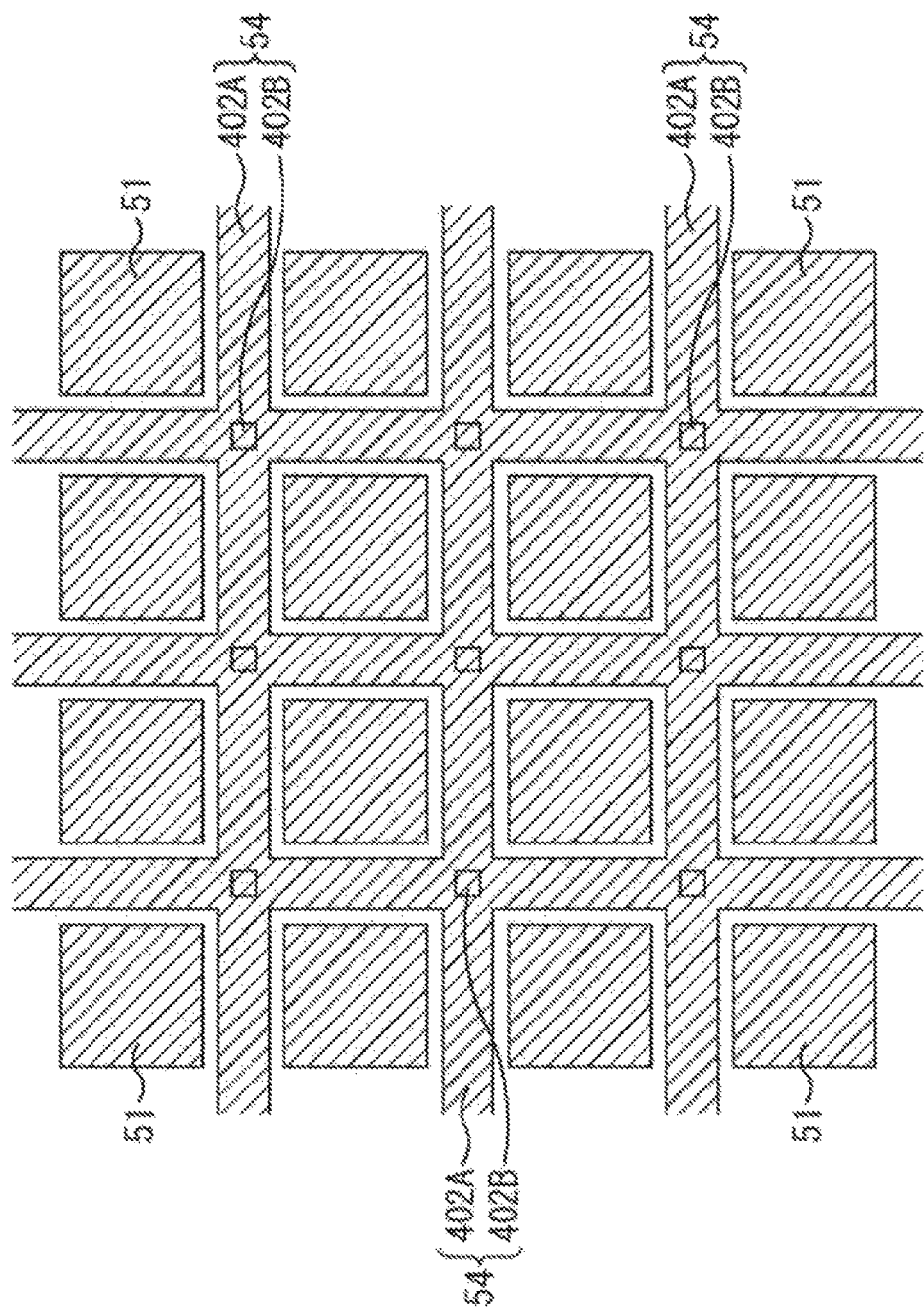
FIG. 27 is a diagram illustrating other exemplary layout of inter-pixel electrodes according to the 10th embodiment.

FIG. 25 to FIG. 27 are the diagrams illustrating exemplary plane layouts of the inter-pixel electrodes 54 and the lower electrodes 51 according to the 10th embodiment.

In the plane layout illustrated in FIG. 25, both the plane electrode part 402A and the protruded electrode part 402B configuring an inter-pixel electrode 54 are on a border between pixels 2, and are formed between adjacent lower electrodes 51 at a predetermined pattern width in a grid shape.

To the contrary, in the plane layout illustrated in FIG. 26, the plane electrode part 402A is formed between adjacent lower electrodes 51 in a predetermined pattern width in a grid shape, while the protruded electrode part 402B is formed at a predetermined interval in an island shape along the plane electrode part 402A in a grid shape.

Further, in the plane layout illustrated in FIG. 27, the plane electrode part 402A is formed between adjacent lower electrodes 51 at a predetermined pattern width in a grid shape, while the protruded electrode part 402B is formed in an island shape only at the cross parts of the plane electrodes 402A formed in a grid shape.

A plane layout of the inter-pixel electrodes 54 may employ any layout illustrated in FIG. 25 to FIG. 27.

<13. 11th Embodiment of Pixels>
<Cross-Section Configuration Diagram of Pixels>

Figure 28:
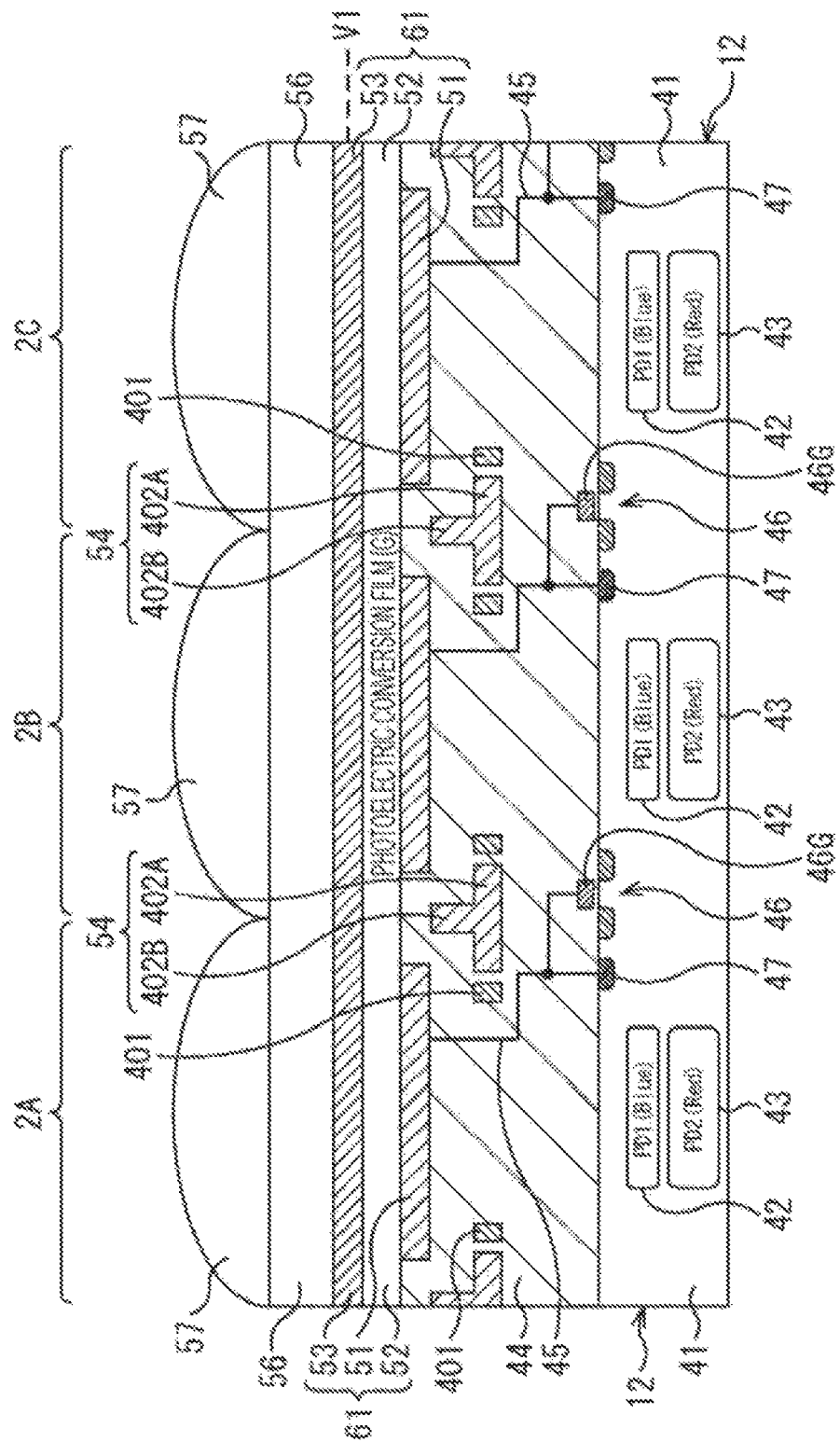
FIG. 28 is a cross-section configuration diagram of pixels according to an 11th embodiment.

FIG. 28 is a diagram illustrating a cross-section configuration of the pixels 2 according to an 11th embodiment.

The inter-pixel electrodes 54 according to the 11th embodiment are common with those according to the 10th embodiment illustrated in FIG. 24 in that each of them is configured of the plane electrode part 402A and the protruded electrode part 402B.

On the other hand, the inter-pixel electrodes 54 according to the 11th embodiment are different from those according to the 10th embodiment illustrated in FIG. 24 in that the width of the plane electrode part 402A is larger than the width between adjacent lower electrodes 51. In other words, the periphery of the lower electrode 51 partially overlaps on the periphery of the plane electrode part 402A in the plane region. The width of the plane electrode part 402A is set to be larger than the width between adjacent lower electrodes 51 in this way, thereby more uniformly causing potential modulation by the inter-pixel electrode 54 in the space between the adjacent lower electrodes 51.

<14. 12th Embodiment of Pixels>
<Cross-Section Configuration Diagram of Pixels>

Figure 29:
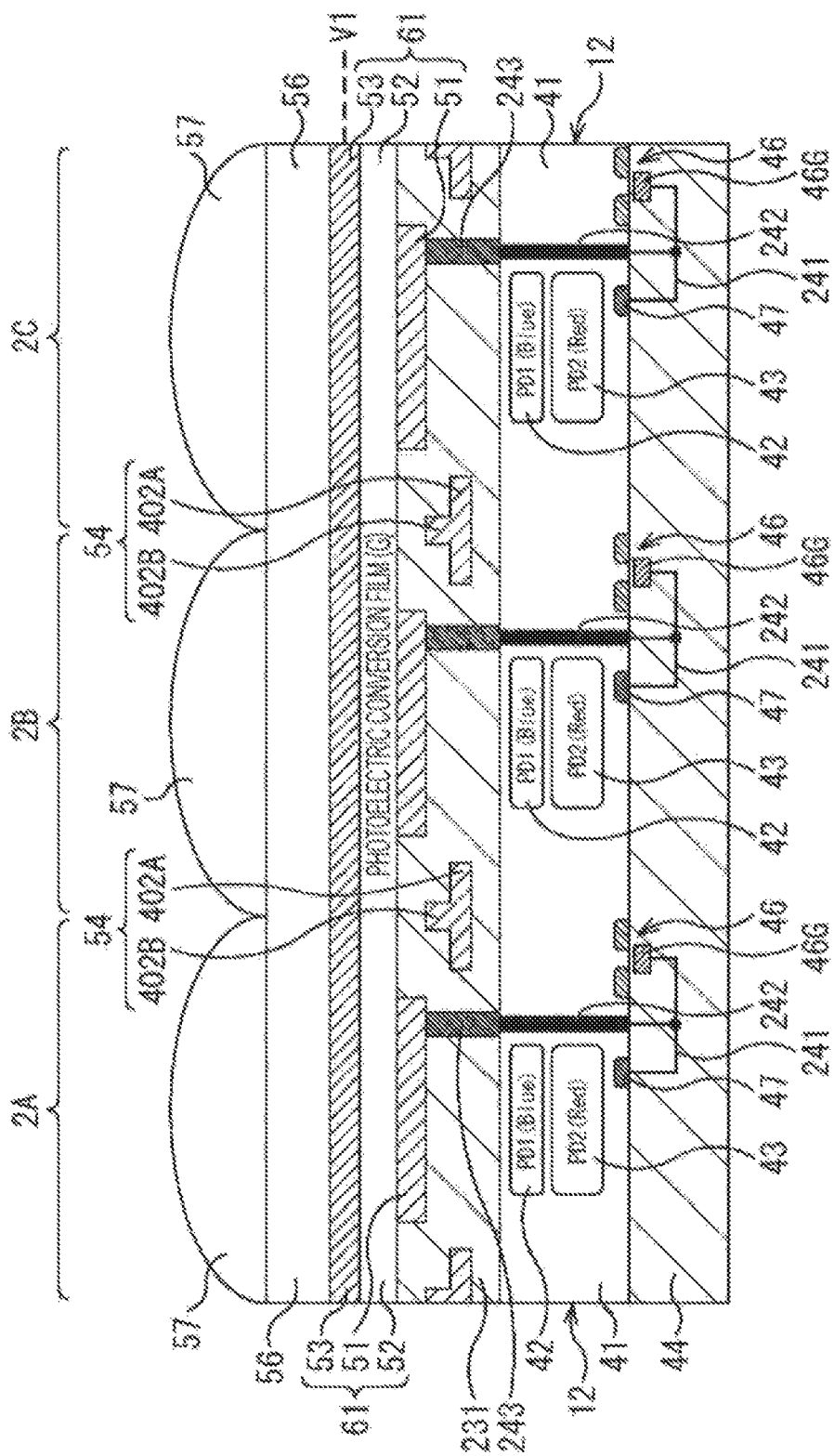
FIG. 29 is a cross-section configuration diagram of pixels according to a 12th embodiment.

FIG. 29 is a diagram illustrating a cross-section configuration of the pixels 2 according to a 12th embodiment.

The 12th embodiment is configured such that the upside-down T-shaped inter-pixel electrodes 54 illustrated in FIG. 24 are applied to the solid state image sensor of backside irradiation type. The 12th embodiment is similar to the 10th embodiment described with reference to FIG. 24 in the inter-pixel electrodes 54, and is similar to the eighth embodiment described with reference to FIG. 19 in other components.

Additionally, though not illustrated, the inter-pixel electrodes 54 according to the ninth embodiment or the 11th embodiment are applicable to the solid state image sensor of backside irradiation type.

According to the ninth to 12th embodiments described above, the inter-pixel electrodes 54 are formed in a lower layer than the layer in which the lower electrodes 51 are formed, thereby reducing the pixel size. Further, when the inter-pixel distance is not shortened, the lower electrodes 54 can be formed in a larger plane size.

<15. 13th Embodiment of Pixels>
<Cross-Section Configuration Diagram of Pixels>

FIG. 30 is a diagram illustrating a cross-section configuration of the pixels 2 according to a 13th embodiment.

The 13th embodiment is different from the first to 12th embodiments described above in that the inter-pixel electrodes 54 are not employed.

The photoelectric conversion unit 61 is configured of the lower electrodes 51, the photoelectric conversion film 52 and the upper electrode 53 according to the first to 12th embodiments, while a buffer layer 421 is formed between the lower electrodes 51 and the photoelectric conversion film 52 according to the 13th embodiment. A blocking layer 422 for blocking leak between adjacent lower electrodes 51 is formed on a border between pixels in the same layer as the buffer layer 421 in which a lower electrode 51 is not formed.

The buffer layer 421 is made of an organic material, and has a function of promoting to transfer holes as signal charges from the photoelectric conversion film 52 to the lower electrodes 51 and preventing electrons from flowing.

On the other hand, the buffer layer 421 has a light distribution property and operates to increase conductivity of the photoelectric conversion film 52, and thus if the buffer layer 421 is formed on the entire pixel array part 3 including the borders between pixels, the buffer layer 421 functions as a leak path and leak is caused between adjacent lower electrodes 51. Current generated due to the leak between lower electrodes 51 is output as dark current. Therefore, according to the 13th embodiment, the insulative blocking layer 422 for blocking leak between lower electrodes 51 is configured between adjacent buffer layers 421 as illustrated in FIG. 30.

A method for manufacturing the pixels 2 according to the 13th embodiment will be described with reference to FIGS. 31A and 31B.

The manufacture method up to formation of the photoelectric conversion unit 61 and the high refractive index layer 56 is similar to the method for manufacturing the pixies 2 according to the first embodiment described with reference to FIGS. 16A 16B and 16C and FIGS. 17A, 17B and 17C. Incidentally, according to the 13th embodiment, the buffer layer 421 configuring part of the photoelectric conversion unit 61 is further formed between the lower electrodes 51 and the photoelectric conversion film 52 as illustrated in FIG. 31A.

A resist mask 441 is formed on top of the high refractive index layer 56 and a light element such as nitrogen (N) or boron (B) is ion-implanted into the buffer layer 421 to form the blocking layers 422 such that the regions in which the blocking layer 422 is formed, specifically the regions other than the plane regions in which the lower electrode 51 is formed are opened as illustrated in of FIG. 31B. An ion implantation depth is set such that a distribution of impurity concentration (dopant profile) is at a peak in the buffer layer 421 as illustrated in of FIG. 31B. A light element such as nitrogen (N) or boron (B) is assumed as ion-implanted impurity, and thus as few damages as possible are caused on the surface of the high refractive index layer 56.

After the blocking layers 422 are formed, the resist mask 441 is removed and the on-chip lenses 57 are formed thereby to complete the pixels 2 illustrated in FIG. 30.

According to the 13th embodiment described above, in the pixels 2 including the photoelectric conversion unit 61 including the buffer layer 421 having a function of increasing conductivity of the photoelectric conversion film 52, when a predetermined voltage is applied to the photoelectric conversion unit 61, leak current caused between adjacent lower electrodes 51 can be restricted by the blocking layers 422, thereby restricting dark current from being generated.

<16. Exemplary Application to Electronic Devices>

The technology in the present disclosure is not limited to applications to solid state image sensors. That is, the technology in the present disclosure is applicable to general electronic devices using a solid state image sensor for an image capture unit (photoelectric conversion unit) such as imaging devices including digital still camera or video camera, portable terminal devices having an imaging function, or copying machines using a solid state image sensor for an image reading unit. A solid state image sensor may be formed as one chip, or may be in a module form having an imaging function in which an imaging unit and a signal processing unit or an optical system are collectively packaged.

Figure 32:
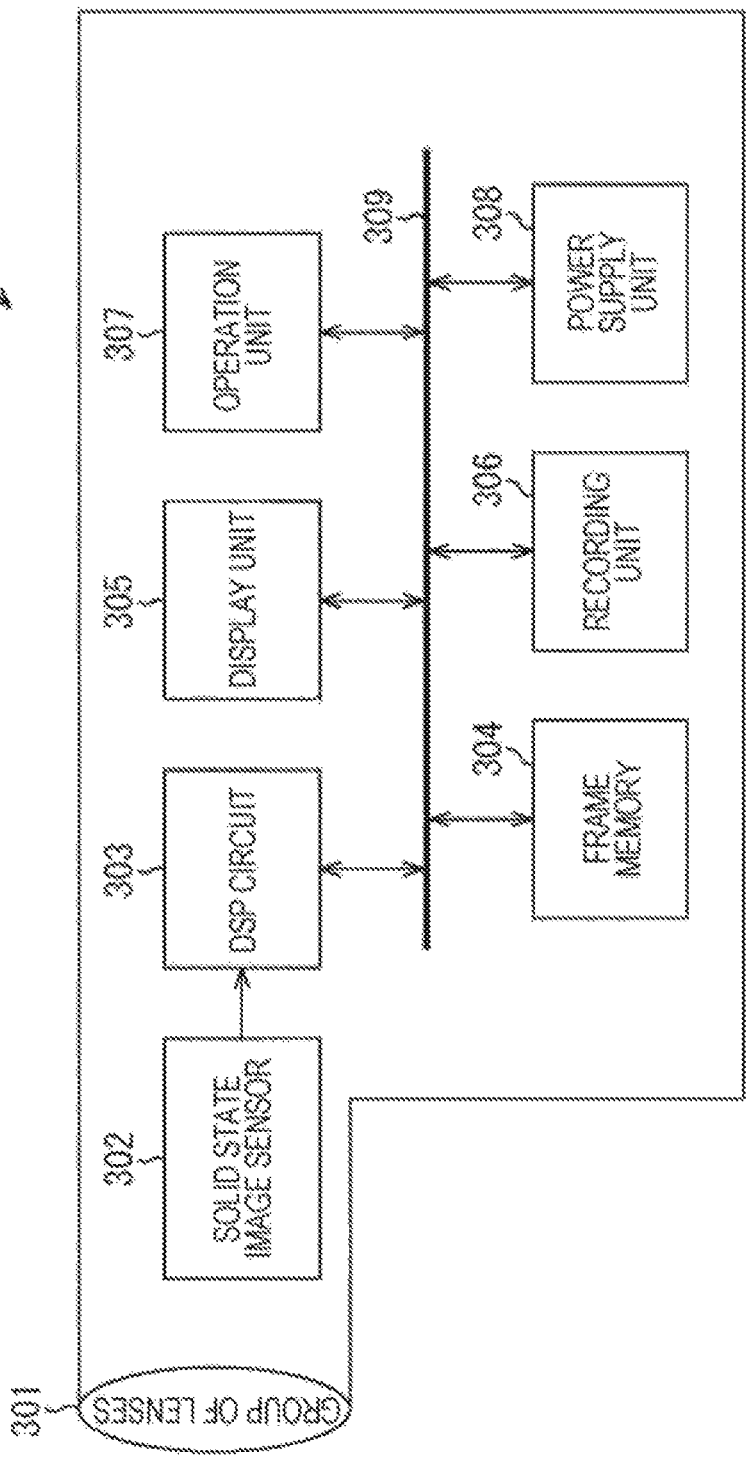
FIG. 32 is a block diagram illustrating an exemplary configuration of an imaging device as electronic device according to the present disclosure.

FIG. 32 is a block diagram illustrating an exemplary configuration of an imaging device as electronic device according to the present disclosure.

An imaging device 300 in FIG. 32 includes an optical unit 301 formed of a group of lenses, a solid state image sensor (imaging device) 302 employing the configuration of the solid state image sensor 1 in FIG. 1, and a digital signal processor (DSP) circuit 303 as camera signal processing circuit. The imaging device 300 further includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are mutually connected via a bus line 309.

The optical unit 301 takes in an incident light (image light) from a subject and forms an image on the imaging face of the solid state image sensor 302. The solid state image sensor 302 converts the amount of incident light image-formed on the imaging face by the optical unit 301 into an electric signal in units of pixel, and outputs the electric signal as pixel signal. The solid state image sensor 302 can employ the solid state image sensor 1 in FIG. 1, or the solid state image sensor having the pixel structure in which an inter-pixel electrode 54 is present between lower electrodes 51 separated per pixel or the pixel structure in which the buffer layer 421 and the blocking layers 422 are provided.

The display unit 305 is configured of a panel-type display device such as liquid crystal panel or organic electro luminescence (EL) panel, and displays an animation or still image shot by the solid state image sensor 302. The recording unit 306 records the animation or still image shot by the solid state image sensor 302 in a recording medium such as hard disc or semiconductor memory.

The operation unit 307 issues operation instructions for various functions of the imaging device 300 by user operations. The power supply unit 308 supplies various power supplies as operation power supplies of the DSP circuit 303, the frame memory 304, the display unit 305, the recording unit 306, and the operation unit 307 to the components as needed.

As described above, the solid state image sensor 1 having the pixels 2 according to each embodiment described above is employed for the solid state image sensor 302, thereby reducing signal mixture due to electric capacitive coupling between adjacent pixels and improving reliability or photoelectric conversion characteristic. Therefore, higher image quality of shot images can be achieved also in the imaging device 300 such as video camera, digital still camera, or camera module for mobile device such as cell phone.

Embodiments of the present disclosure are not limited to the above embodiments, and various changes can be made without departing from the spirit of the present disclosure.

According to the first to sixth embodiments, there has been described above the longitudinally-spectroscopic solid state image sensor having one photoelectric conversion layer (the photoelectric conversion film 52) on the semiconductor substrate 12 and having two inorganic photoelectric conversion layers (the photodiodes PD1 and PD2) in the semiconductor substrate 12.

However, the technology in the present disclosure is similarly applicable to a longitudinally-spectroscopic solid state image sensor having two photoelectric conversion layers on the semiconductor substrate 12 and having one inorganic photoelectric conversion layer in the semiconductor substrate 12.

Further, the description has been made above according to each embodiment assuming that an organic photoelectric conversion material is used for the photoelectric conversion film 52 in the photoelectric conversion unit 61 formed above the semiconductor substrate 12, but an inorganic photoelectric conversion material may be employed therefor. The inorganic photoelectric conversion materials include compound semiconductors such as crystal silicon, amorphous silicon, CIGS (Cu, In, Ga, Se compound), CIS (Cu, In, Se compound), chalcopyrite-based semiconductor, and GaAs.

The upper electrode 53 configuring the photoelectric conversion unit 61 is commonly formed on the total surfaces of all the pixels and the lower electrodes 51 are formed in units of pixel according to each embodiment described above, but the upper electrodes 53 may be formed in units of pixel and the lower electrode 51 may be commonly formed on the total surfaces of all the pixels. Further, both the lower electrodes 51 and the upper electrodes 53 may be formed in units of pixel.

The solid state image sensor assuming holes as signal charges has been described in the above examples, but the present disclosure is applicable to solid state image sensors assuming electrons as signal charges. Further, the description has been made assuming the first conductive type of P and the second conductive type of N of the semiconductor substrate 12, but a configuration assuming the first conductive type of N and the second conductive type of P can be employed.

Further, the technology in the present disclosure is applicable to general solid state image sensors (physical amount distribution detection devices) such as solid state image sensors for imaging a distribution of the incident amounts of infrared ray, X-ray, or particles, or fingerprint detection sensors for detecting and imaging a distribution of other physical amounts such as pressure or electrostatic capacitance in a broad sense, not limited to applications to solid state image sensors for detecting and imaging a distribution of the amounts of incident visible light.

Embodiments of the present disclosure are not limited to the above embodiments, and various changes can be made without departing from the spirit of the present disclosure.

For example, all or some of the above embodiments may be combined.

Additionally, the effects described in the specification are merely exemplary and are not limited, and any effect other than the effects described in the specification may be obtained.

Additionally, the present disclosure can take the following configurations.

(1)

A solid state image sensor including, a first pixel and a second pixel arranged adjacently, each of the first pixel and the second pixel having a photoelectric conversion film for photoelectrically converting an incident light, and a lower electrode arranged below the photoelectric conversion film, and another electrode different from the lower electrodes is provided between the lower electrodes of the first pixel and the second pixel.

(2)

The solid state image sensor according to (1), in which the lower electrode is connected to a gate electrode of an output transistor for outputting charges generated by the photoelectric conversion film.

(3)

The solid state image sensor according to (1) or (2), further including:

a voltage control unit for applying a predetermined voltage to the another electrode.

(4)

The solid state image sensor according to (3), in which the voltage control unit controls a voltage to be applied to the another electrode to control the number of charges captured in the lower electrodes.

(5)

The solid state image sensor according to any of (1) to (4), in which a voltage to be applied to an upper electrode arranged above the photoelectric conversion film is controlled so that a voltage of the lower electrode is reset at a voltage of the another electrode.

(6)

The solid state image sensor according to any of (1) to (5), in which the another electrode is connected to a wiring layer in the pixels.

(7)

The solid state image sensor according to any of (1) to (6), in which the another electrode is connected to a GND region formed in a semiconductor substrate.

(8)

The solid state image sensor according to any of (1) to (7), in which the another electrode contacts the photoelectric conversion film.

(9)

The solid state image sensor according to any of (1) to (7), in which an insulative film is present between the another electrode and the photoelectric conversion film.

(10)

The solid state image sensor according to (9), in which the insulative film does not have a photoelectric conversion function.

(11)

The solid state image sensor according to any of (1) to (10), in which the another electrode is connected to a gate electrode of an output transistor for outputting charges generated in the photoelectric conversion film above the another electrode.

(12)

The solid state image sensor according to any of (3), (9), or (10), in which the another electrode is formed in a lower layer than the lower electrodes.

(13)

The solid state image sensor according to (12), in which the another electrode has a plane electrode part extended in the plane direction formed in a lower layer than the lower electrodes, and a protruded electrode part protruded upward as high as the lower surfaces of the lower electrodes.

(14)

The solid state image sensor according to (12) or (13), in which the another electrode is formed in a lower layer than the lower electrodes and has a larger width than the width between the adjacent lower electrodes.

(15)

The solid state image sensor according to any of (1) to (14), in which each of the first pixel and the second pixel further includes an inorganic photoelectric conversion unit in a semiconductor substrate, and the inorganic photoelectric conversion unit photoelectrically converts a wavelength light which is not photoelectrically converted by the photoelectric conversion film.

(16)

The solid state image sensor according to any of (1) to (15), in which the photoelectric conversion film is made of an organic material.

(17)

The solid state image sensor according to any of (1) to (16) which is of backside irradiation type.

(18)

A method for manufacturing a solid state image sensor, the method including:
forming a photoelectric conversion film for photoelectrically converting an incident light and a lower electrode arranged below the photoelectric conversion film as part of each of a first pixel and a second pixel which are adjacently arranged, and forming another electrode different from the lower electrodes between the lower electrodes of the first pixel and the second pixel.

(19)

An electronic device including a solid state image sensor including,
a first pixel and a second pixel arranged adjacently,
each of the first pixel and the second pixel having a photoelectric conversion film for photoelectrically converting an incident light, and a lower electrode arranged below the photoelectric conversion film, and
another electrode different from the lower electrodes is provided between the lower electrodes of the first pixel and the second pixel.

(20)

A solid state image sensor including,
a first pixel and a second pixel arranged adjacently,
each of the first pixel and the second pixel having a photoelectric conversion film for photoelectrically converting an incident light, a buffer layer, and a lower electrode arranged below the photoelectric conversion film and the buffer layer, and
an insulative blocking layer provided between the lower electrodes of the first pixel and the second pixel in the same layer as the buffer layer.

REFERENCE SIGNS LIST

1 Solid state image sensor
2 Pixel
3 Pixel array part
4 Vertical drive circuit
12 Semiconductor substrate
44 Multilayered wiring layer
46 Output transistor
47 FD unit
51 Lower electrode
52 Photoelectric conversion film
53 Upper electrode
54 Inter-pixel electrode
61 Photoelectric conversion film
62 Reset transistor
PD1, PD2 Photodiode
91 Metal wiring
92 GND region
101 Wiring layer
102 Contact via
141 Output transistor
142 FD unit
161 Photoelectric conversion film
162 Color filter
300 Imaging device
302 Solid state image sensor
402A Plane electrode part
402B Protruded electrode part
421 Buffer layer
422 Blocking layer

The invention claimed is:

1. A solid state image sensor, comprising:
a first pixel adjacent to a second pixel, wherein each of the first pixel and the second pixel comprises:
a photoelectric conversion film configured to photoelectrically convert an incident light, and
a first electrode on a non-light incident side of the photoelectric conversion film; and a second electrode, different from the first electrode, between the first electrode of each of the first pixel and the second pixel, wherein the second electrode is below the first electrode, from a light incident side of the solid state image sensor.

2. The solid state image sensor according to claim 1, wherein the first electrode, connected to a gate electrode of an output transistor, is configured to output charges generated by the photoelectric conversion film.

3. The solid state image sensor according to claim 1, further comprising:
a voltage control unit configured to apply a first voltage to the second electrode.

4. The solid state image sensor according to claim 3, wherein the voltage control unit is further configured to control the first voltage applied to the second electrode to control a number of charges captured in the first electrode.

5. The solid state image sensor according to claim 3, wherein the voltage control unit is further configured to:
apply a second voltage to a third electrode arranged on a light incident side of the photoelectric conversion film, and
control the second voltage of the third electrode to reset a third voltage of the first electrode the first voltage of the second electrode.

6. The solid state image sensor according to claim 1, wherein the second electrode is connected to a wiring layer in the first pixel and the second pixel.

7. The solid state image sensor according to claim 1, wherein the second electrode is connected to a ground (GND) region formed in a semiconductor substrate.

8. The solid state image sensor according to claim 1, wherein the second electrode is in contact with the photoelectric conversion film.

9. The solid state image sensor according to claim 1, further comprising:
an insulative film between the second electrode and the photoelectric conversion film.

10. The solid state image sensor according to claim 9, wherein the insulative film is incapable of photoelectric conversion.

11. The solid state image sensor according to claim 1, wherein the second electrode, connected to a gate electrode of an output transistor, is configured to output charges generated by the photoelectric conversion film.

12. The solid state image sensor according to claim 1, wherein the second electrode comprises:
a plane electrode part which extends in a plane direction, and
a protruded electrode part which protrudes upward till a lower surface of the first electrode.

13. The solid state image sensor according to claim 1, further comprising:
a plurality of first electrodes which comprises the first electrode, wherein
the second electrode is in a lower layer than the plurality of first electrodes, and
a first width of the second electrode is larger than a second width between each pair of adjacent electrodes of the plurality of first electrodes.

14. The solid state image sensor according to claim 1, wherein
each of the first pixel and the second pixel further comprises an inorganic photoelectric conversion unit in a semiconductor substrate, and
the inorganic photoelectric conversion unit is configured to photoelectrically convert a wavelength light, of the incident light, which is not photoelectrically converted by the photoelectric conversion film.

15. The solid state image sensor according to claim 1, wherein the photoelectric conversion film comprises an organic material.

16. The solid state image sensor according to claim 1, wherein the solid state image sensor is of backside irradiation type.

17. A method for manufacturing a solid state image sensor, the method comprising:
forming a photoelectric conversion film for photoelectrically converting an incident light;
forming a first electrode on a non-light incident side of the photoelectric conversion film, wherein
the photoelectric conversion film and the first electrode are formed as a part of each of a first pixel and a second pixel, and
the first pixel is adjacent to the second pixel; and
forming a second electrode, different from the first electrode, between the first electrode of each of the first pixel and the second pixel and the second electrode is below the first electrode, from a light incident side of the solid state image sensor.

18. An electronic device, comprising:
a solid state image sensor, comprising:
a first pixel adjacent to a second pixel, wherein each of the first pixel and the second pixel comprises:
a photoelectric conversion film configured to photoelectrically convert incident light,
a first electrode on a non-light incident side of the photoelectric conversion film, and
a second electrode, different from the first electrode, between the first electrode of each of the first pixel and the second pixel, wherein the second electrode is below the first electrode, from a light incident side of the solid state image sensor.

19. A solid state image sensor, comprising:
a first pixel adjacent to a second pixel, wherein each of the first pixel and the second pixel comprises:
a photoelectric conversion film configured to photoelectrically convert an incident light,
a buffer layer on a non-light incident side of the photoelectric conversion film, and
a first electrode on the non-light incident side of the photoelectric conversion film and the buffer layer, and
an insulative blocking layer, between the first electrode of each of the first pixel and the second pixel, in a same layer as the buffer layer, wherein the insulative blocking layer is incapable of photoelectric conversion.

* * * * *